United States Patent
Choi et al.

(10) Patent No.: US 7,110,286 B2
(45) Date of Patent: Sep. 19, 2006

(54) PHASE-CHANGE MEMORY DEVICE AND METHOD OF WRITING A PHASE-CHANGE MEMORY DEVICE

(75) Inventors: Byung-Gil Choi, Yongin-si (KR); Choong-Keun Kwak, Suwon-si (KR); Du-Eung Kim, Yongin-si (KR); Beak-Hyung Cho, Osan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 207 days.

(21) Appl. No.: 10/919,371

(22) Filed: Aug. 17, 2004

(65) Prior Publication Data

US 2005/0169093 A1 Aug. 4, 2005

(30) Foreign Application Priority Data

Feb. 4, 2004 (KR) ............... 10-2004-0007112

(51) Int. Cl.
*G11C 11/00* (2006.01)

(52) U.S. Cl. .................... 365/163; 365/230.06
(58) Field of Classification Search ............. 365/113, 365/163 O, 185.18, 185.19, 189.04, 230.06 X
See application file for complete search history.

(56) References Cited

U.S. PATENT DOCUMENTS

| 6,480,438 B1 | 11/2002 | Park |
| 6,813,177 B1 * | 11/2004 | Lowrey et al. ............. 365/148 |
| 6,937,507 B1 * | 8/2005 | Chen ......................... 365/163 |

* cited by examiner

*Primary Examiner*—VanThu Nguyen
(74) *Attorney, Agent, or Firm*—Volentine Francos & Whitt, PLLC

(57) ABSTRACT

A phase-change cell memory device includes a plurality of phase-change memory cells, an address circuit, a write driver, and a write driver control circuit. The phase-change memory cells each include a volume of material that is programmable between amorphous and crystalline states. The address circuit selects at least one of the memory cells, and the write driver generates a reset pulse current to program a memory cell selected by the address circuit into the amorphous state, and a set pulse current to program the memory cell selected by the address circuit into the crystalline state. The write driver control circuit varies at least one of a pulse width and a pulse count of at least one of the reset and set pulse currents according to a load between the write driver and the memory cell selected by the address circuit.

48 Claims, 24 Drawing Sheets

During a reset programming (DATA = "High")

PHASE-CHANGE MEMORY DEVICE AND METHOD OF WRITING A PHASE-CHANGE MEMORY DEVICE

BACKGROUND OF THE INVENTION

1. Field of the Invention

The present invention generally relates to phase-change memory devices and methods for writing phase-change memory cells. More particularly, the present invention relates to phase-change memory devices and methods of writing phase-change memory devices in which write current pulse characteristics are varied according to a load of a phase-change cell to be written.

2. Description of the Related Art

Phase change memory cell devices rely on phase change materials, such as chalcogenide, which are capable of stably transitioning between amorphous and crystalline phases. The differing resistance values exhibited by the two phases are used to distinguish logic values of the memory cells. That is, an amorphous state exhibits a relatively high resistance, and a crystalline state exhibits a relatively low resistance.

FIG. 1 illustrates a phase-change memory cell in an amorphous state 52-1 and in a crystalline state 52-2. The phase-change memory cell may be part of a Phase-change Random Access Memory (PRAM). The phase-change memory cell 52 includes a phase-change layer 55 between a bottom electrode (BE) 54 and an upper electrode (UE) 56. The phase-change layer 55 is formed of a phase-change material, such as a chalcogenide alloy (GST). A bit line (BL) is coupled to the upper electrode 56. The bottom electrode 54 is coupled to ground through transistor NT. A word line (WL) is coupled to the gate of transistor NT.

When phase-change memory cell 52 is in an amorphous state 52-1, a portion of the phase-change layer 55 is amorphous. Likewise, when phase-change memory cell 52 is in a crystalline state 52-2, the portion of the phase-change layer 55 is crystalline. As shown by the equivalent circuit diagram in FIG. 1, the phase-change material layer 55 is SET (ST1) to the crystalline state or RESET (ST2) to the amorphous state depending on an electrical current applied via the bit line BL.

As would be appreciated by one skilled in the art, the terms "amorphous state" and "crystalline state" are not absolute characterizations of the phase-change material. Rather, when a portion of the phase-change material is said to be in an amorphous state (i.e. a RESET state), this means that the material is sufficiently amorphous to take on a resistive value R1 which may be readily distinguished from a resistive value R2 of the material in the crystalline state (SET state). Conversely, when a portion of the phase-change material is said to be in a crystalline state (SET state), this means that the material is sufficiently crystalline to take on a resistive value which may be readily distinguished from the resistive value of the material in the amorphous state (RESET state).

FIG. 2 illustrates the temperature characteristics of a phase-change memory cell in a set programming operation and a reset programming operation. A set programming operation causes a phase-change material layer of a phase-change memory cell to crystallize, thus decreasing the resistivity of the phase-change material layer. Likewise, a reset programming operation causes a phase-change material layer of a phase-change memory cell to become amorphous, thus increasing the resistivity of the phase-change material layer.

As illustrated in FIG. 2, the programming of a phase-change memory cell is dependent on the temperature of the phase-change memory cell. An amorphizing (RESET) temperature pulse includes a rising portion 12, a peak portion 10, and a declining portion 14. In order to reset a phase-change memory cell, using an amorphizing (RESET) pulse, the phase change material layer is heated above its melting point (Tm) by a resistive heater for a relatively short period of time. Between time T0 and time T1, the temperature of the phase-change material layer is rapidly increased to a temperature above the melting point (Tm) of the phase-change material layer. During the declining portion 14, the phase-change material layer is rapidly cooled, thus causing the phase-change material layer to become relatively amorphous. In other words, raising the temperature of the phase-change material layer above its melting point (Tm) causes crystal structures in the phase-change material to be broken apart. Because the phase-change material layer is cooled rapidly, there is little opportunity for crystals to form in the phase-change material layer before the phase-change material layer becomes solid in a relatively amorphous state.

Likewise, a crystallizing (SET) temperature pulse includes a rising portion 22, a peak portion 20, and a declining portion 24. In order to set a phase-change memory cell, using a crystallizing (SET) pulse, the phase change material layer is heated above its crystallization point (Tx) by a resistive heater for a relatively short period of time (e.g. 50 ns), which is longer than the period of time that the temperature is raised during a amorphizing (RESET) temperature pulse. Between time T0 and time T2, the temperature of the phase-change material layer is rapidly increased to above the crystallization point (Tx) of the phase-change material layer and crystallization occurs. During the declining portion 24, the phase-change material layer is rapidly cooled, thus causing the phase-change material layer to set in a relatively crystalline state.

FIG. 3 comparatively illustrates the RESET current pulse G1 and the SET current pulse G2. The RESET current pulse G1, which is a relatively short pulse of magnitude I-RESET, causes the temperature of the phase-change material to RESET the material into an amorphous state as shown above in FIG. 2. The SET current pulse G2, which is a relatively long pulse of magnitude I-SET (where I-SET is less than I-RESET), causes the temperature of the phase-change material to SET the material into crystalline state as shown above in FIG. 2.

FIG. 4 illustrates a memory 100 having a phase-change memory cell array 160. As shown, the cell array 160 includes a plurality of memory blocks, namely, Block(A00) 160a, Block(A01) 160b, Block(A10) 160c, and Block (A11) 160d. Each memory block includes a plurality phase-change memory cells commonly connected to a word lines WLi, WLj, WLk, and WLl respectively contained in the memory blocks.

Buffers 110_1 and 110_2 receive addressing signals A0 and A1. The address signals A0 and A1 are decoded by a pre-decoder 120 to generate decoded signals A00_DEC, A01_DEC, A10_DEC, and A11_DEC, which in turn are decoded by a main decoder 140 to output block selection signals A00, A01, A10 and A11. The block selection signals A00, A01, A10 and A11 drive word lines WLi, WLj, WLk, and WLl of memory blocks 160a, 160b, 160c, and 160d, respectively.

A write driver 130 outputs a SET or RESET write current pulse SDL according to a programming signal SET(RESET)_CON_PULSE and a data signal DIN from buffer 111. A column decoder 150 then supplies the write current pulse SDL to the memory blocks 160a, 160b, 160c, and 160d.

As illustrated in example FIG. 4, memory block 160d is closer to decoder 150 than memory cell block 160a. Accordingly, different loads are present from decoder 150 to the memory blocks 160a, 160b, 160c, and 160d. These loads are represented in the figure by resistive elements R1, R2, R3 and R4.

The differing loads of the memory blocks 160a, 160b, 160c, and 160d, result in different write conditions of the phase change memory cells of the memory blocks. This is explained with reference to FIGS. 5 through 7.

FIG. 5 is a simplified diagram illustrating the different set programming pulses (e.g. SET_CON_PULSE) applied to the phase-change memory cell blocks 160a, 160b, 160c, and 160d of the memory array 160. As can be seen from FIG. 5, the set programming pulses all have the same pulse width.

FIG. 6 illustrates the RESET resistance distribution regions of the phase-change memory cells in blocks 160a, 160b, 160c, and 160d. As the load of the memory blocks is increased, the resistance distribution region is decreased. In order to avoid write errors, the RESET write current pulse must be capable of writing the highest-load memory block 160a such that the lowest resistance distribution region (Region (A00)) is fully in a RESET region. Since the memory block 160d has the lowest load, a relatively strong RESET write current pulse is applied to memory cells of the memory block 160d. As such, a relatively high crystalline state is achieved which results in a relatively high resistance distribution region (Region (A11)). Conversely, the memory block 160a with the greatest load will exhibit a relatively low resistance distribution region (Region (A00)).

FIG. 7 illustrates the SET resistance distribution regions of the phase-change memory cells in blocks 160a, 160b, 160c, and 160d. Again, as the load of the memory blocks is increased, the resistance distribution region is decreased. In order to avoid write errors, the SET write current pulse must be capable of writing the lowest-load memory block 160d such that the highest resistance distribution region (Region (A11)) is fully in a SET region. Otherwise, SET failures will occur in the portion WIN of the distribution region of the nearest block (Region (A11)). Thus, in order to bring the Region (A11) fully into the SET region, the phase-change memory cells of the Region (A00) become "over-programmed". That is, power is unnecessarily expended with regards to the SET programming of the phase-change memory cells associated with Region (A00). Further, additional power is needed to bring the same memory cells back into the RESET region during RESET programming.

SUMMARY OF THE INVENTION

According to an aspect of the present invention, a phase-change cell memory device is provided which includes a plurality of phase-change memory cells, an address circuit, a write driver, and a write driver control circuit. The phase-change memory cells each include a volume of material that is programmable between amorphous and crystalline states. The address circuit selects at least one of the memory cells, and the write driver generates a reset pulse current to program a memory cell selected by the address circuit into the amorphous state, and a set pulse current to program the memory cell selected by the address circuit into the crystalline state. The write driver control circuit varies at least one of a pulse width and a pulse count of at least one of the reset and set pulse currents according to a load between the write driver and the memory cell selected by the address circuit.

According to another aspect of the present invention, a phase-change cell memory device is provided which includes a plurality of memory cell blocks, an address circuit, a write driver, and a write driver control circuit. The memory cell blocks each include a plurality of phase-change memory cells, and each of the phase-change memory cells includes a volume of material that is programmable between amorphous and crystalline states. The address circuit selects each of the memory cell blocks, and the write driver selectively generates a reset pulse current to program memory cells of a memory cell block selected by the address circuit into the amorphous set state, and a set pulse current to program memory cells of the memory cell block selected by the address circuit into the crystalline state. The write driver control circuit varies at least one of a pulse width and a pulse count of at least of the set and reset pulse currents according to the memory cell block selected by the address circuit.

According to still another aspect of the present invention, a phase-change cell memory device is provided which includes a phase-change memory cell array, an address decoder, a bit line selection circuit, a write driver, and a write driver control circuit. The phase-change memory cell array includes a plurality of word lines, a plurality of bit lines, and a plurality of phase-change cells at respective intersection regions of the word lines and bit lines, where the memory cell array is defined by a plurality of memory blocks each including at least one word line, and where each of the phase-change memory cells includes a volume of material that is programmable between amorphous and crystalline states. The address decoder decodes an input row address to select a word line of each memory block, and to select one of the memory blocks. The bit line selection circuit selects at least one bit line according to an input column address. The write driver selectively generates a reset pulse current to program a memory cell at the intersection of the selected bit line and the selected word line within the selected memory block into the amorphous set state, and a set pulse current to program a memory cell at the intersection of the selected bit line and the selected word line within the selected memory block into the crystalline state. The write driver control circuit varies at least one a pulse width and a pulse count of at least one of the set and reset pulse currents according to the memory cell block selected by the address decoder.

According to yet another aspect of the present invention, a method is provided of programming a phase-change memory device having a plurality of phase-change memory cells each including a volume of material that is programmable between amorphous and crystalline states. The method includes using a write driver to selectively generate a reset pulse current to program the memory cells selected by an address circuit into the amorphous state, and a set pulse current to program the memory cells selected by the address circuit into the crystalline state, and varying at least one of a pulse width and a pulse count of the reset and set pulse currents according to a load between the write driver and the memory cells being programmed.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE INVENTION

The present invention is generally characterized by controlling a write driver of a phase-change memory device such that at least one of a pulse width and a pulse count of at least one of RESET and SET pulse currents are varied according to a load between the write driver and an addressed memory cell. In this manner, over-programming of memory cells can be avoided, thus reducing the power consumption needed to reliably write the cells into the SET and/or RESET states.

The present invention will now be described in detail by way of several preferred but non-limiting embodiments.

Figure 8:
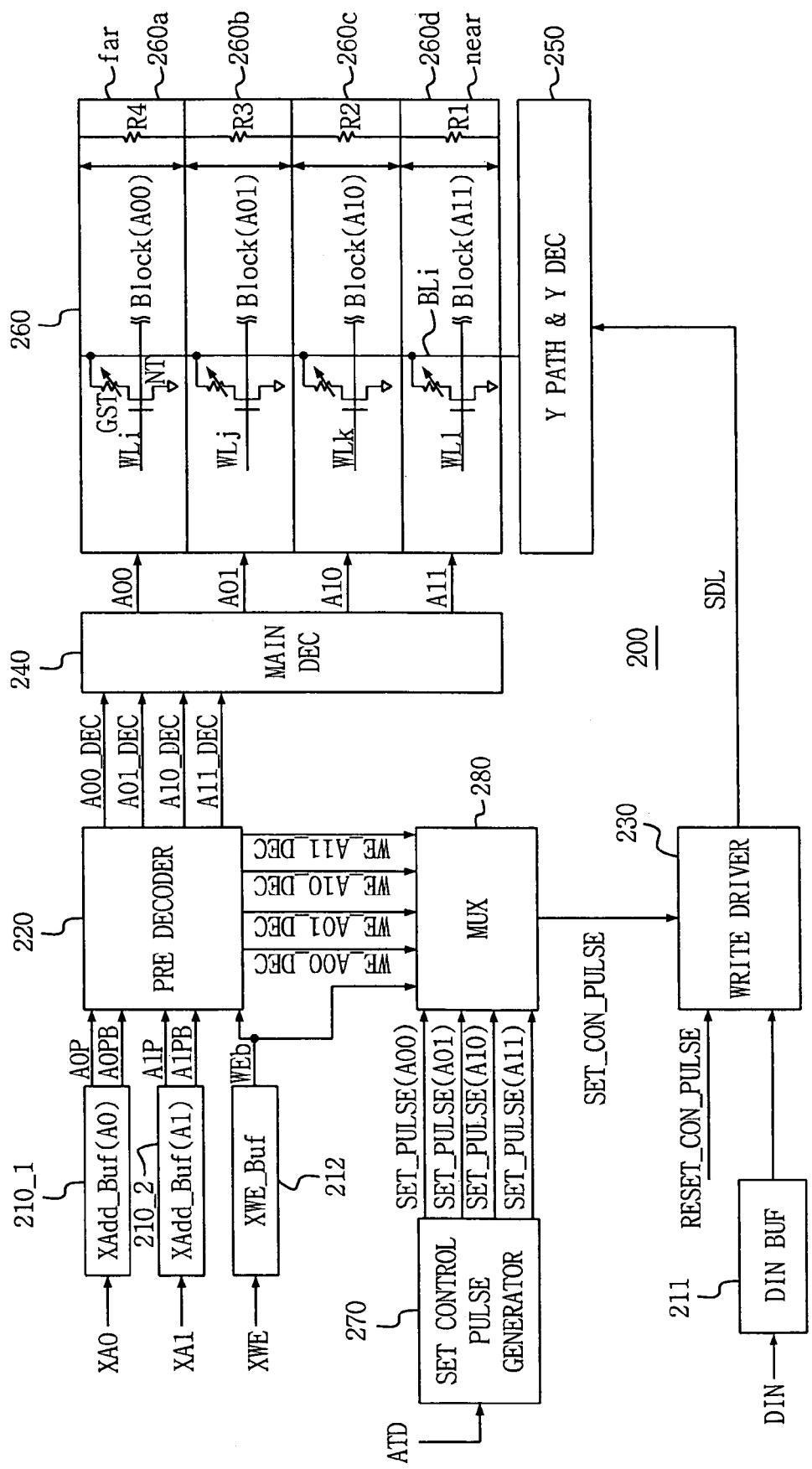
FIG. 8 is a circuit diagram of a phase-change memory cell device according to an embodiment of the present invention.

FIG. 8 is a circuit diagram of a phase-change memory cell device 200 according to an exemplary embodiment of the present invention. As shown, the phase-change memory cell device 200 includes address buffers 210_1 and 210_2, a input data buffer (DIN BUF) 211, a write enable buffer 212, a pre-decoder 220, a write driver 230, a main decoder 240, a memory array 260, a SET control pulse generator 270, a multiplexer (MUX) 280.

The input buffer 210_1 receives an input address signal XA0 and outputs buffered address signals A0P and A0PB to the pre-decoder 220. Likewise, the input buffer 210_2 receives an input address signal XA1 and outputs buffered address signals A1P and A1PB to the pre-decoder 220. Further, the write enable signal buffer 212 receives write enable signal XWE and outputs buffered write enable signal WEb to the pre-decoder 220 and the multiplexer 280.

The pre-decoder 220 receives the buffered address signals A0P, A0PB, A1P and ALPB, and the buffered write enable signal WEb, and outputs decoded address signals A00_DEC, A01_DEC, A10_DEC, and A11_DEC to the main decoder 240, and further outputs decoded write control signals WE_A00_DEC, WE_A01_DEC, WE_A10_DEC, and WE_A11_DEC to the multiplexer 280. In this exemplary embodiment, the decoded write control signals WE_A00_DEC, WE_A01_DEC, WE_A10_DEC, and WE_A11_DEC indicate which one of the blocks 260a, 260b, 260c, and 260d of the memory array 260 is being written.

The main decoder 240 receives the decoded signals A00_DEC, A01_DEC, A10_DEC, and A11_DEC, and outputs block selection signals A00, A01, A10 and A11. The block selection signals A00, A01, A10 and A11 drive word lines WLi, WLj, WLk, and WLl of the blocks 260a, 260b, 260c, and 260d, respectively, of the memory array 260.

The SET control pulse generator 270 is responsive to an address transition detection (ADT) signal to generate a plurality of SET_PULSEs having different pulse widths, namely, SET_PULSE (A00), SET_PULSE (A01), SET_PULSE (A10), and SET_PULSE (A11). As will be explained later in more detail, these different SET_PULSEs are selectively used to set the pulse width of a write SET current pulse applied to the memory array 260.

The multiplexer 280 selects and outputs (as SET_CON_PULSE) one of the SET_PULSE (A00), SET_PULSE (A01), SET_PULSE (A10), and SET_PULSE (A11), according to the buffered write enable signal WEb and the decoded write control signals WE_A00_DEC, WE_A01_DEC, WE_A10_DEC, and WE_A11_DEC. More specifically, when enabled by the buffered write enable signal WEb, the multiplexer 280 outputs the SET_PULSE (A00) when WE_A00_DEC is active; the multiplexer outputs the SET_PULSE (A01) when WE_A01_DEC is active; the multiplexer outputs the SET_PULSE (A10) when WE_A10_DEC is active; and the multiplexer outputs the SET_PULSE (A11) when WE_A11_DEC is active. Note that only one of WE_A00_DEC, WE_A01_DEC, WE_A10_DEC, and WE_A11_DEC is active at any given time.

Depending on the input data signal (DIN) from the input buffer 211, the write driver 230 outputs a write current pulse (SDL) according to either the SET current control pulse SET_CON_PULSE (from the multiplexer 280) or a RESET current control pulse RESET_CON_PULSE. For example, if the data to be written is LOW, the write driver outputs a SET programming write current pulse having a pulse width defined by SET_CON_PULSE. On the other hand, if the data to be written is HIGH, the write driver outputs a RESET programming write current pulse having a pulse width defined by RESET_CON_PULSE. Also, as will be explained later, the write driver 230 outputs a higher current for the RESET programming than for the SET programming (i.e., Ireset>Iset).

Column decoder 250 supplies the write current pulse SDL from the write driver 230 to selected columns of the memory blocks 160a, 160b, 160c, and 160d.

Figure 9:
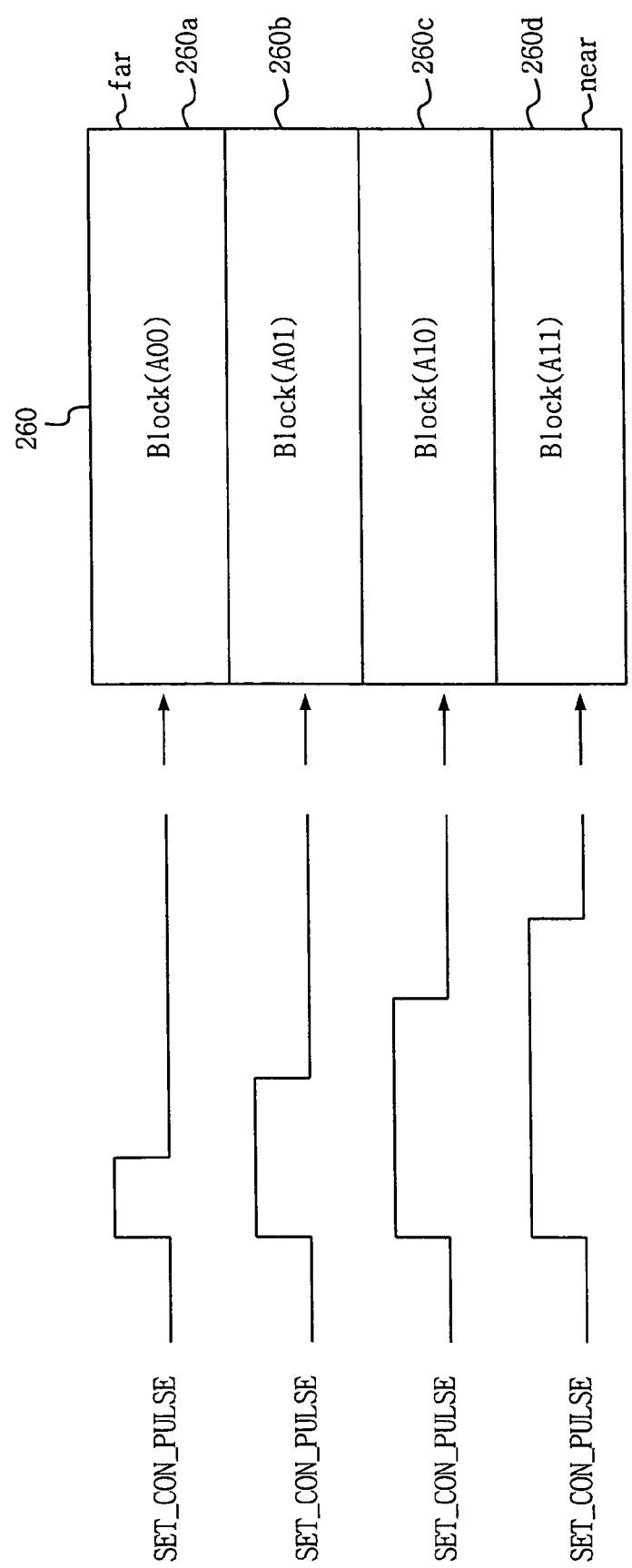
FIG. 9 illustrates set programming pulses applied to the phase-change memory cell blocks according to an embodiment of the present invention.

FIG. 9 illustrates the different pulse widths of SET current control signals (SET_CON_PULSE) which define the pulse widths of the SET write current pulses applied to respective blocks 260a, 260b, 260c, and 260d, of the phase-change memory cell array 260. As illustrated in FIG. 9, the pulse width of a SET current signal input into a far block (260a) is shorter than the pulse width of a SET current signal input into a near block (260d).

Figure 1:
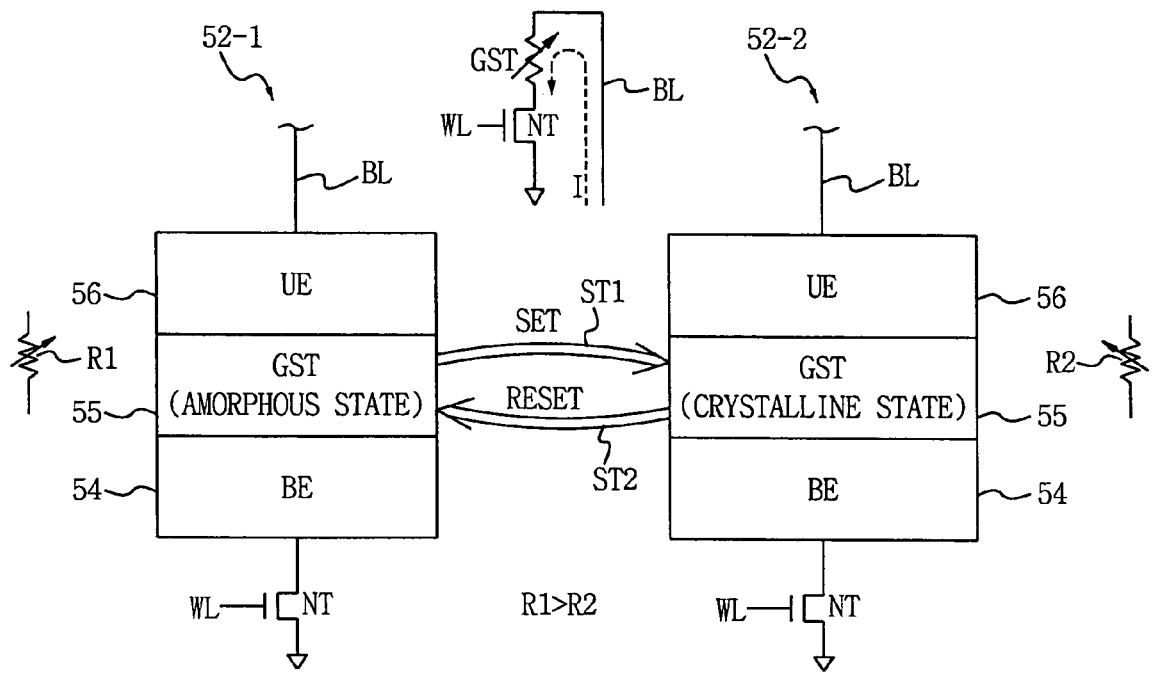
FIG. 1 is an illustration of a phase-change memory cell in an amorphous state and a crystalline state.
Figure 2:
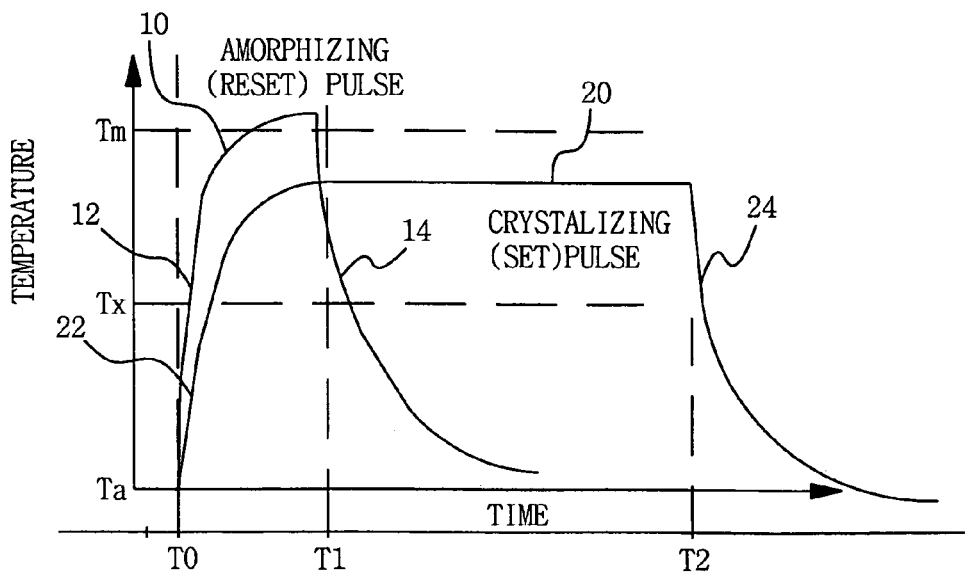
FIG. 2 is a graph illustrating the temperature characteristics of a phase-change memory cell in response to a reset programming signal and a set programming signal.
Figure 3:
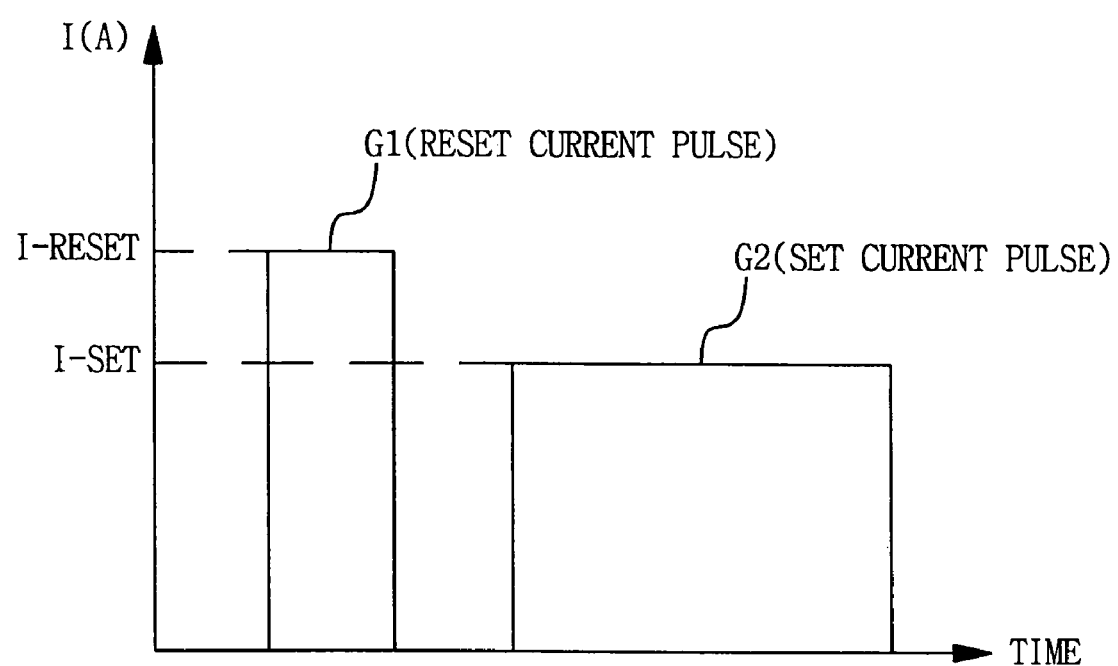
FIG. 3 is a graph illustrating the write current pulses of a reset programming signal and a set programming signal.
Figure 4:
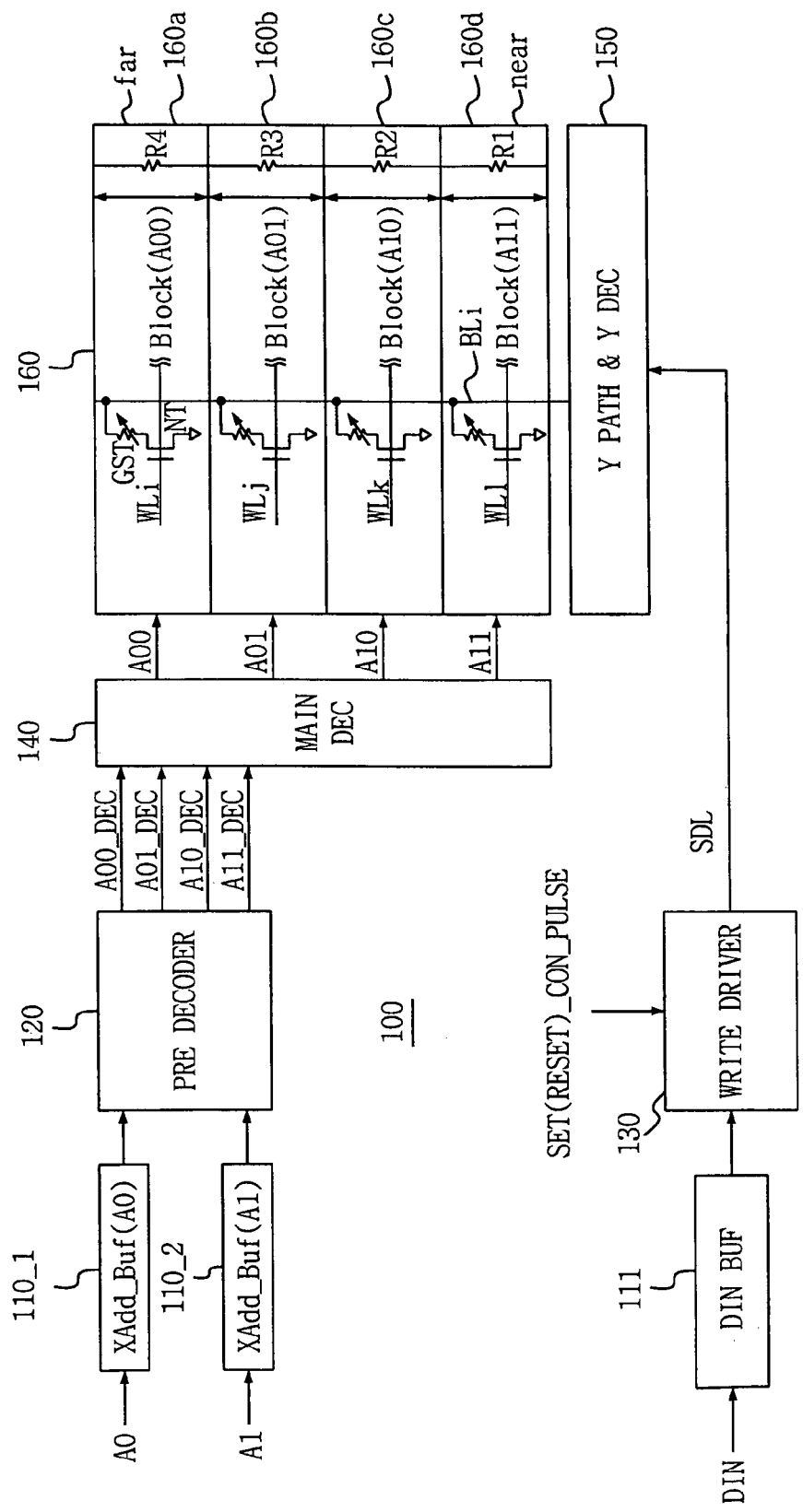
FIG. 4 is a circuit diagram of a phase-change memory cell device.
Figure 5:
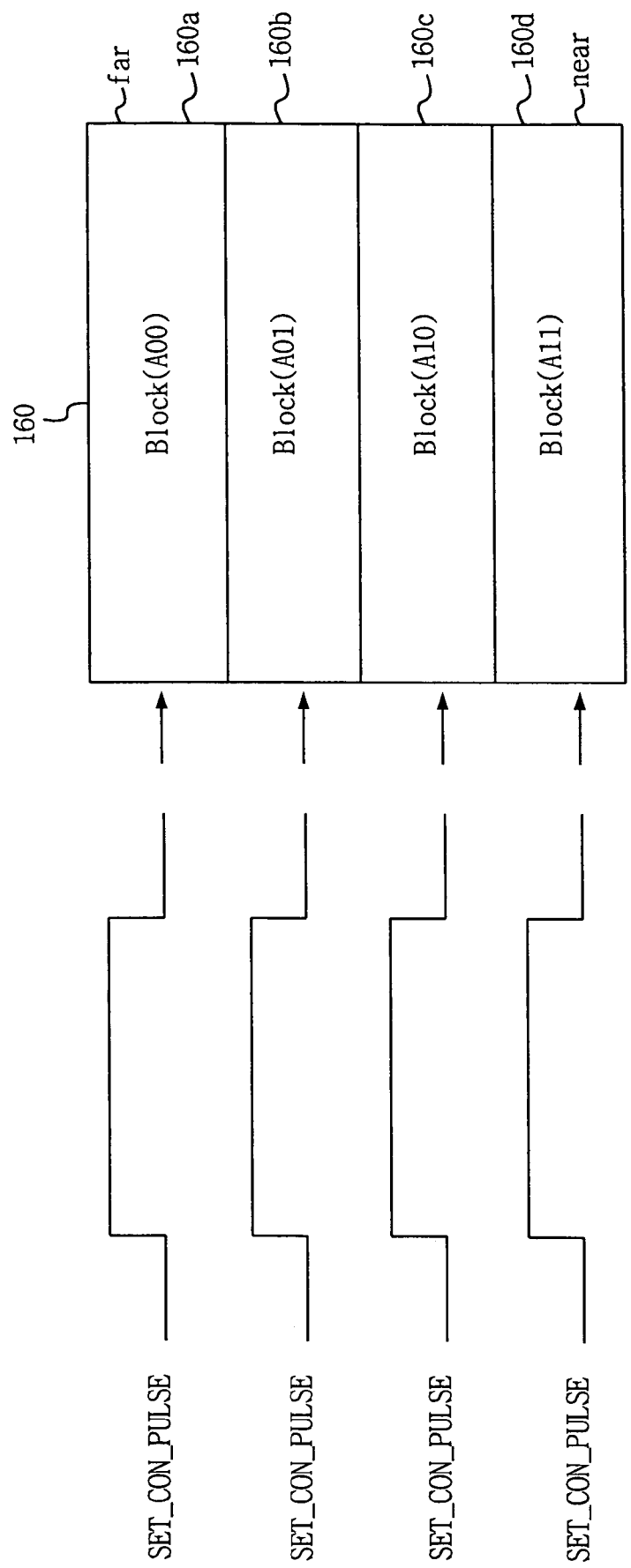
FIG. 5 illustrates set programming pulses applied to the phase-change memory cell blocks.
Figure 6:
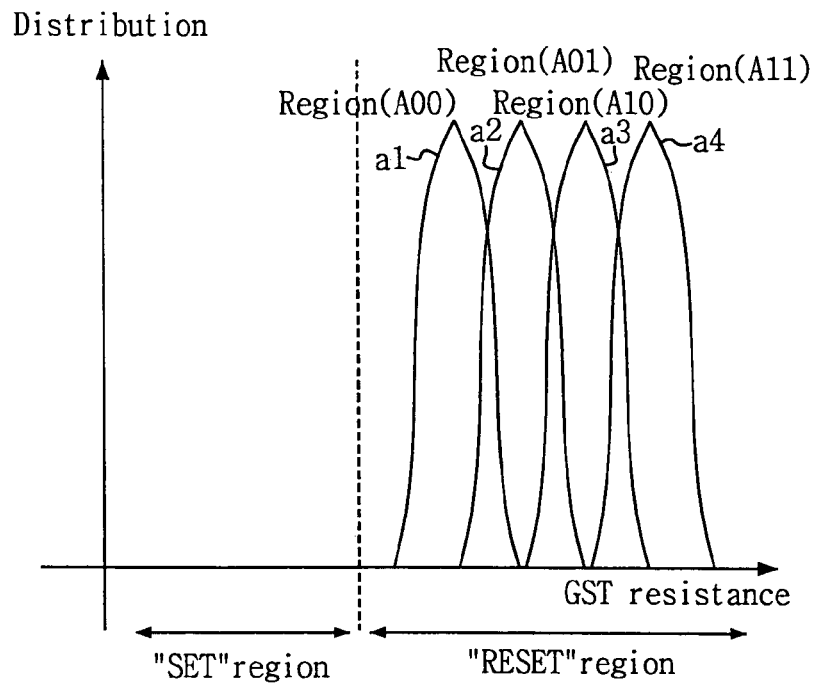
FIG. 6 illustrates RESET resistance distribution regions of phase-change memory cells in different memory blocks.
Figure 7:
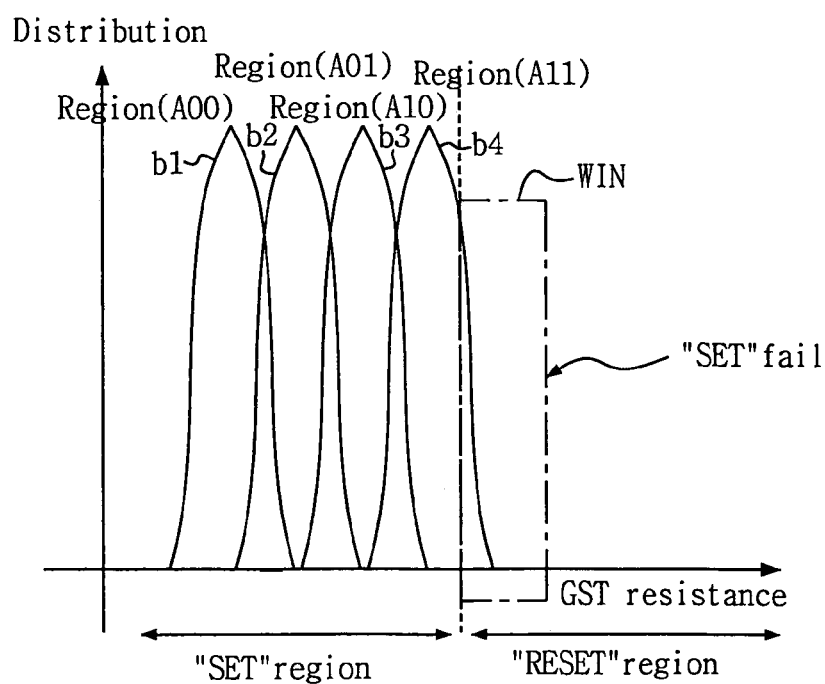
FIG. 7 illustrates SET resistance distribution regions of phase-change memory cells in different memory blocks.
Figure 10:
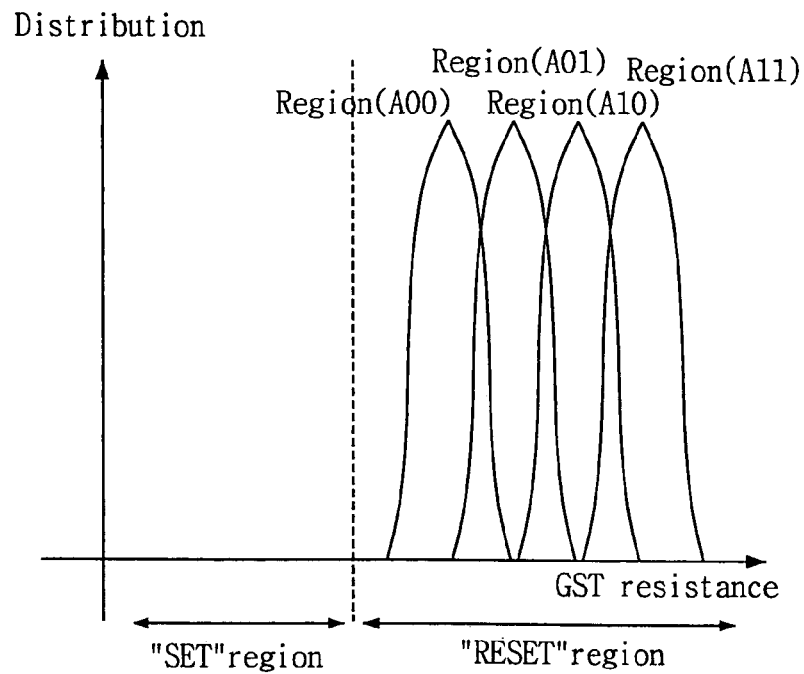
FIG. 10 illustrates RESET resistance distribution regions of phase-change memory cells in different memory blocks according to an embodiment of the present invention.
Figure 11:
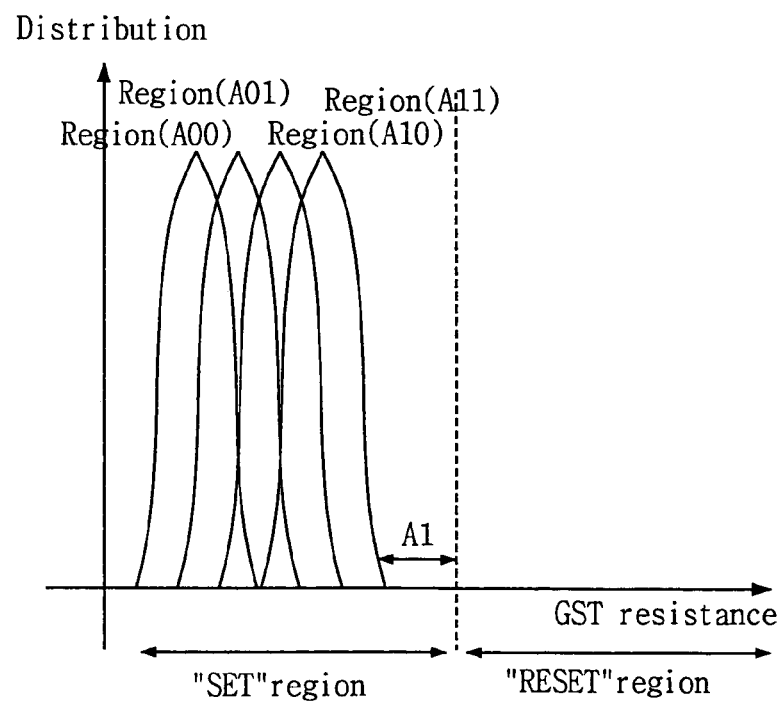
FIG. 11 illustrates SET resistance distribution regions of phase-change memory cells in different memory blocks according to an embodiment of the present invention.

By applying a shorter pulse current width to the far block 260a, over-programming of the memory cells of that block during the SET write operation is avoided. This is graphically illustrated in FIGS. 10 and 11. Assume that the resistance distribution regions during the RESET state are as shown in FIG. 10. Assume next that the SET write operation is carried out using the set current pulses shown in FIG. 9. The resultant resistance distribution regions in the SET state are shown in FIG. 11. When compared to previously discussed FIG. 7, the resistance distribution regions are more compacted, and accordingly, less power is needed to bring the far block 260a back to the RESET region.

Figure 12:
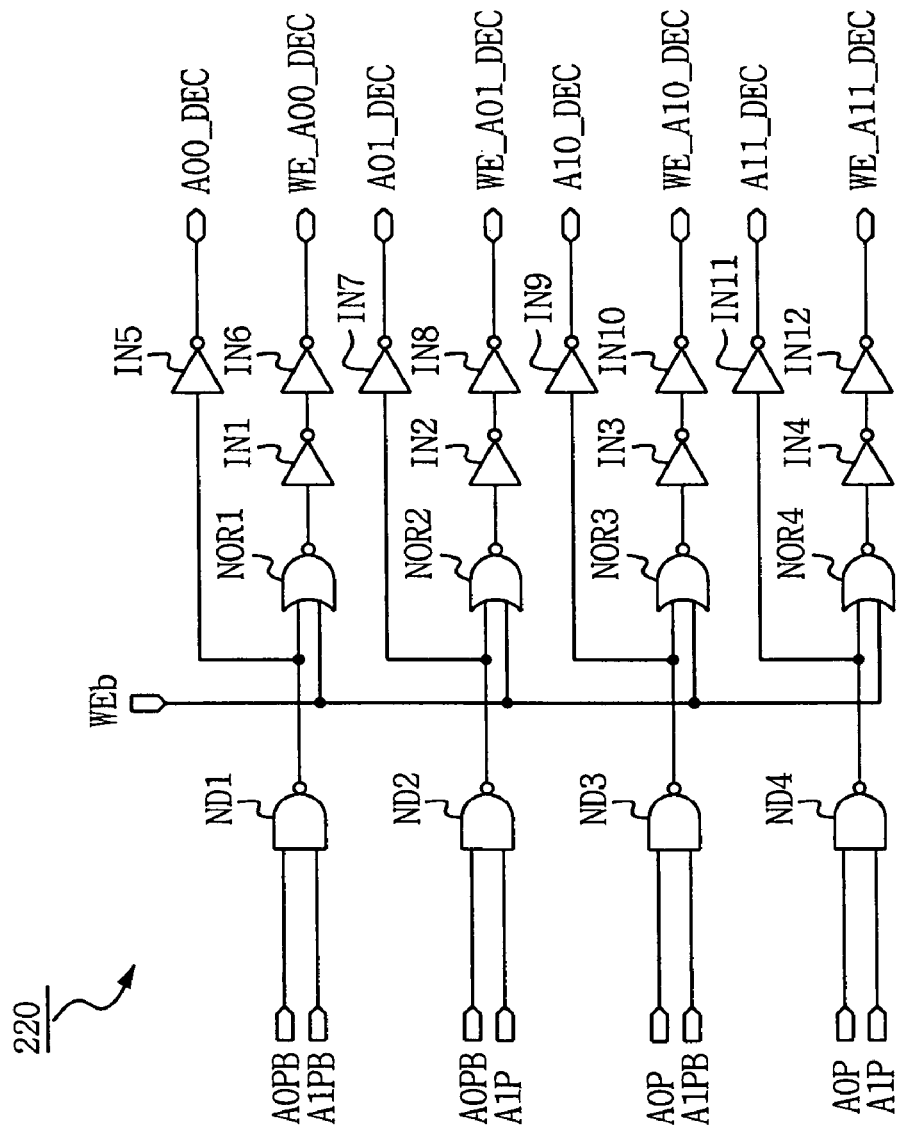
FIG. 12 is a circuit diagram of a pre-decoder according to an embodiment of the present invention.

FIG. 12 is a circuit diagram of a pre-decoder 220 according to an embodiment of the present invention. In this specific example, the pre-decoder 220 includes NAND gates ND1, ND2, ND3, and ND4; NOR gates NOR1, NOR2, NOR3, and NOR4; and inverters IN1, IN2, IN3, IN4, IN5, IN6, IN7, IN8, IN9, IN10, IN11, and IN12. As shown, the pre-decoder 220 receives the buffered address signals A0P, A0PB, A1P and A1PB, and the buffered write enable signal WEb, and outputs-decoded address signals A00_DEC, A01_DEC, A10_DEC, and A11_DEC, and decoded write control signals WE_A00_DEC, WE_A01_DEC, WE_A10_DEC, and WE_A11_DEC. In this example, only one of the decoded write control signals WE_A00_DEC, WE_A01_DEC, WE_A10_DEC, and WE_A11_DEC is HIGH when the buffered write enable signal WEb is LOW.

Figure 13:
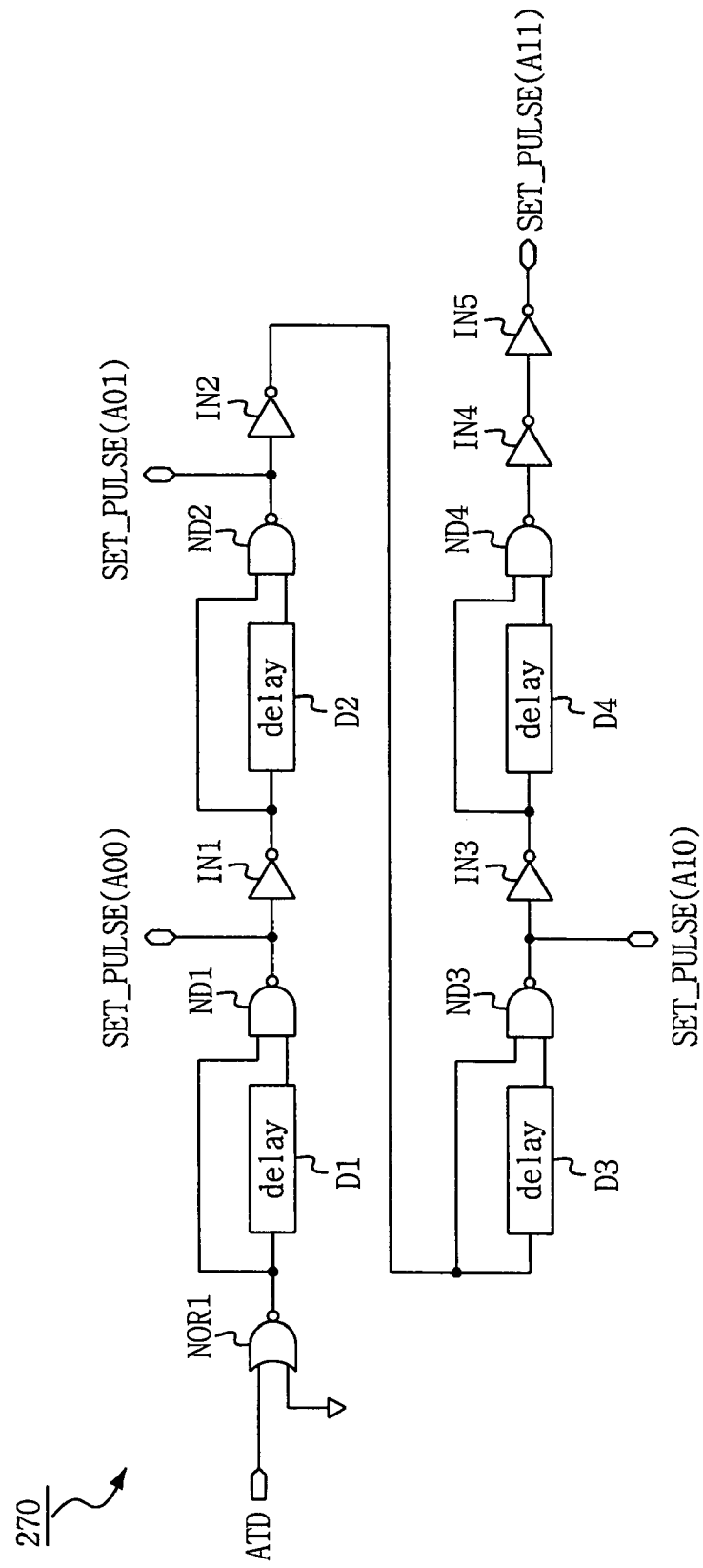
FIG. 13 is a circuit diagram of a set control pulse generator according to an embodiment of the present invention.

FIG. 13 is a circuit diagram of the SET control pulse generator 270 according to an embodiment of the present invention. In this specific example, SET control pulse generator includes NAND gates ND1, ND2, ND3, and ND4; NOR gate NOR1; delay circuits D1, D2, D3, and D4; and inverters IN1, IN2, IN3, IN4, and IN5. As should be apparent, the circuit of FIG. 13 is configured to output SET_PULSE_SIGNALs of different pulse widths as illustrated in FIG. 9.

Figure 14:
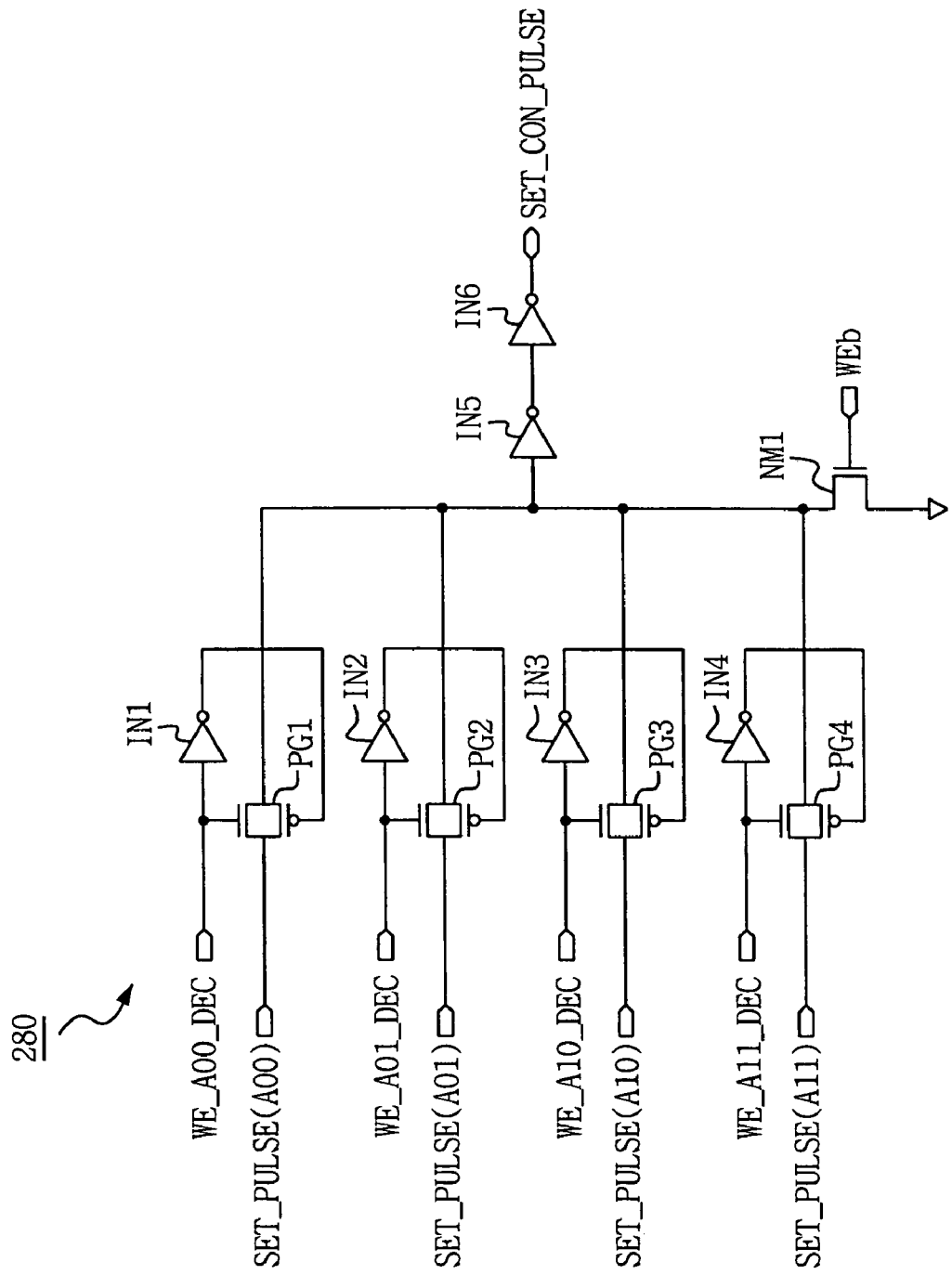
FIG. 14 is a circuit diagram of a multiplexer according to an embodiment of the present invention.

FIG. 14 is a circuit diagram of the multiplexer 280 according to an embodiment of the present invention. The multiplexer 280 of this specific example includes transmission gates PG1, PG2, PG3, and PG4; inverters IN1, IN2, IN3, IN4, IN5, and IN6; and transistor NM1. When the buffered write enable signal WEb is LOW, one of the SET_PULSES (A00), (A01), (A10), or (A11) is output as the SET_CON_PULSE when a respective one of the decoded write control signals WE_A00_DEC, WE_A01_DEC, WE_A10_DEC, and WE_A11_DEC is HIGH.

Figure 15:
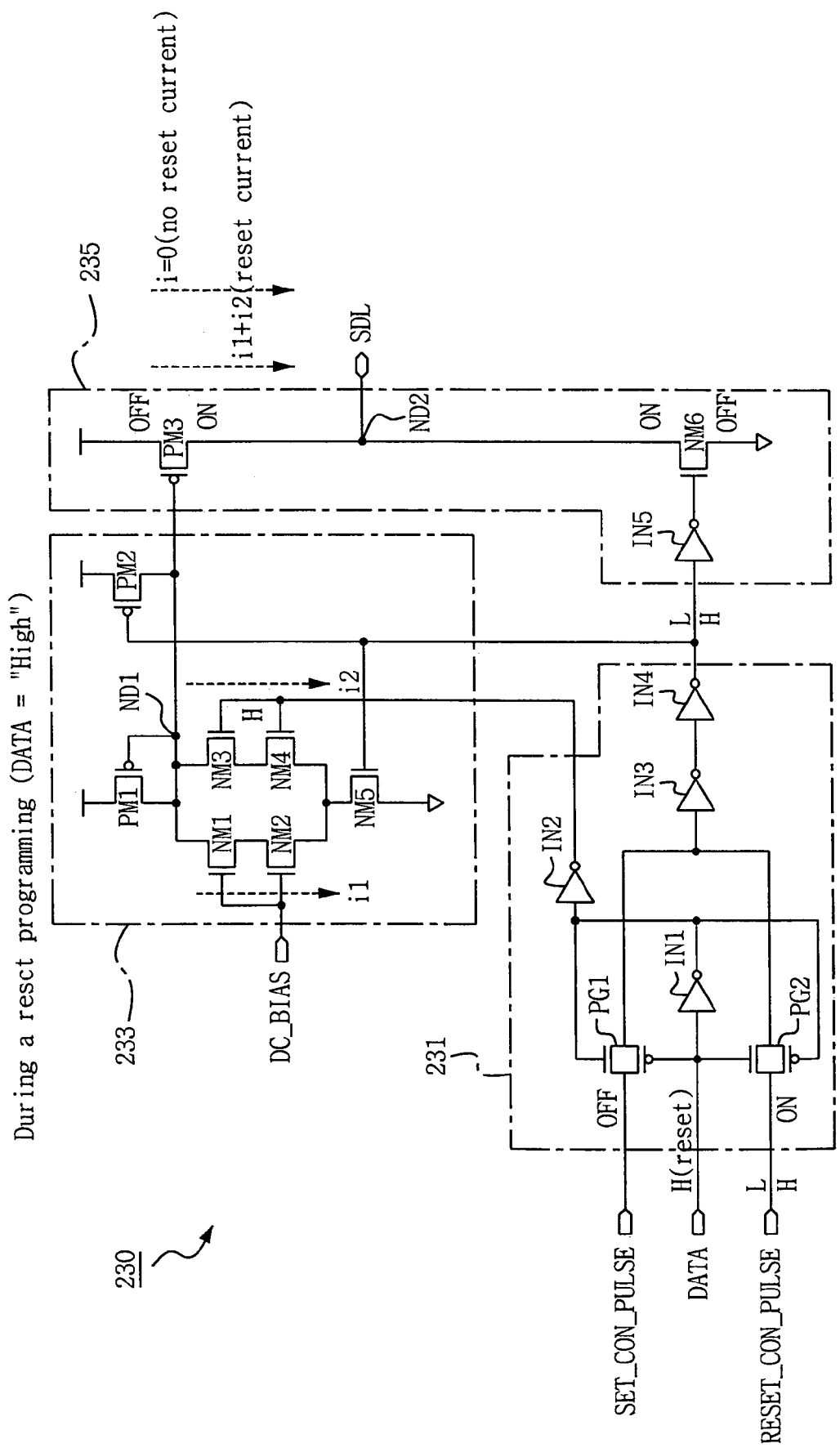
FIG. 15 is a circuit diagram of a write driver according to an embodiment of the present invention, where the write driver is in a RESET operation.
Figure 16:
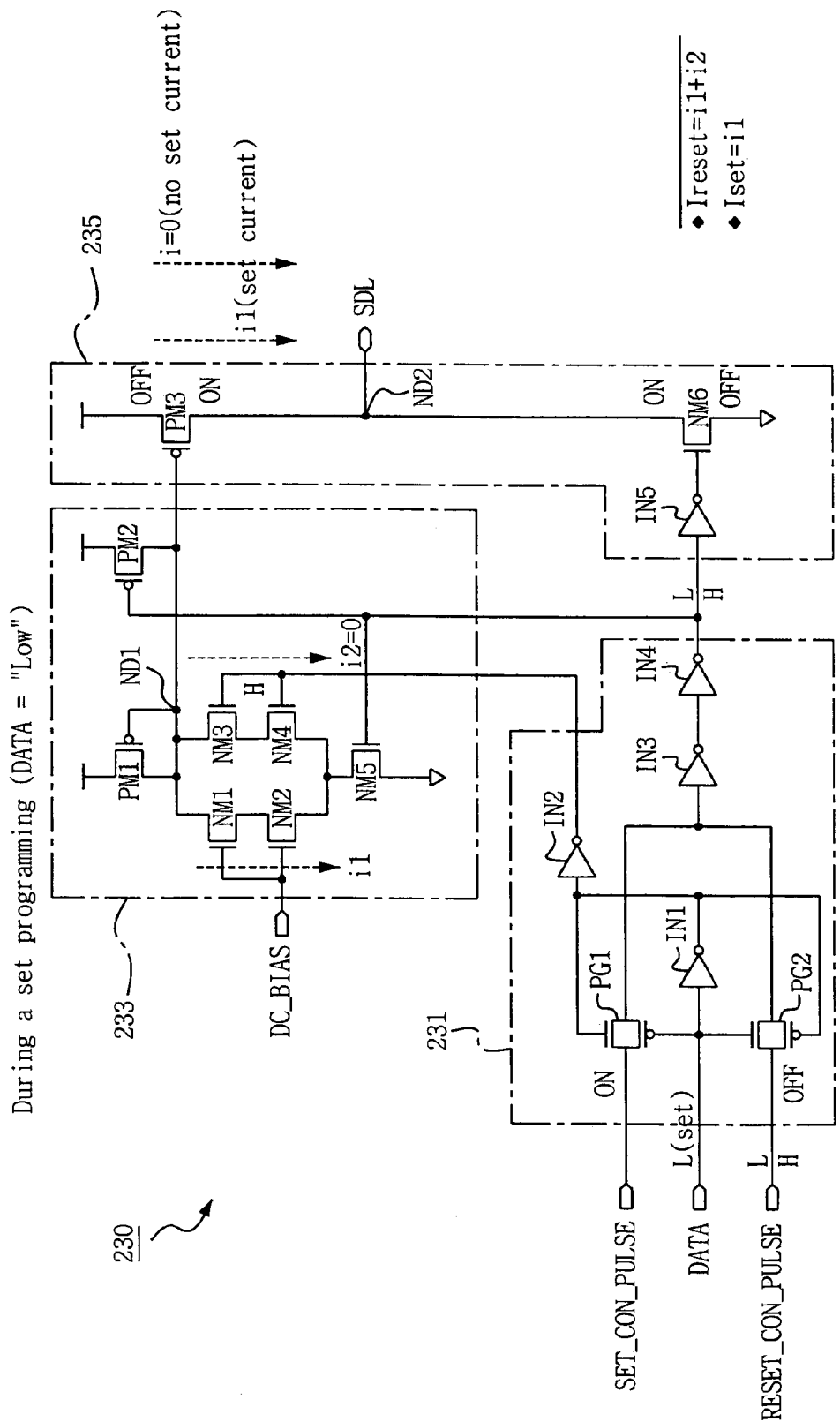
FIG. 16 is a circuit diagram of a write driver according to an embodiment of the present invention, where the write driver is in a SET operation.

FIG. 15 is a circuit diagram of a write driver 230 according to an embodiment of the present invention. The "H", "L", "OFF" and "ON" designations in the figure denote a RESET programming operation where the input data is HIGH. FIG. 16 is the same as FIG. 15, expect that "H", "L", "OFF" and "ON" designations in the figure denote a SET programming operation where the input data is LOW.

In the specific example of FIGS. 15 and 16, the write driver circuit 230 includes a logic circuit 231, a current mirror 233, and an output circuit 235. The logic circuit 231 includes transmission gates PG1 and PG2 and inverters IN1, IN2, IN3, and IN4. The current mirror 233 includes transistors NM1, NM2, NM3, NM4, NM5, PM1, and PM2. The output circuit 235 includes transistors PM3 and NM6, and inverter IN5.

Referring to FIG. 15, in the RESET programming operation, the input data (DATA) is HIGH, which turns off the transmission gate PG1. In the case where the RESET_CON_PULSE is LOW, the output of inverter IN4 of the logic circuit 231 is LOW. As such, transistor NM6 is ON, and transistor NM5 is OFF, and the node ND2 becomes LOW (ground). As a result, the output current SDL becomes Ireset=0 as shown. On the other hand, when the RESET_CON_PULSE is HIGH, the output of inverter IN4 of the logic circuit 231 is HIGH, and the transistor NM6 is turned OFF. Further, since DATA is HIGH, the output of inverter IN2 of the logic circuit 231 is HIGH, and the transistors NM3 and NM4 of the current mirror 233 are turned ON. As a result, the output current SDL becomes Ireset=i1+i2 as shown.

Referring to FIG. 16, in the SET programming operation, the input data (DATA) is LOW, which turns off the transmission gate PG2. In the case where the SET_CON_PULSE is LOW, the output of inverter IN4 of the logic circuit 231 is LOW. As such, transistor NM6 is ON, and transistor NM5 is OFF, and the node ND2 becomes LOW (ground). As a result, the output current SDL becomes Iset=0 as shown. On the other hand, when the SET_CON_PULSE is HIGH, the output of inverter IN4 of the logic circuit 231 is HIGH, and the transistor NM6 is turned OFF. Further, since DATA is LOW, the output of inverter IN2 of the logic circuit 231 is LOW, and the transistors NM3 and NM4 of the current mirror 233 are turned OFF. As a result, the output current SDL becomes Iset=i1 as shown.

Figure 17:
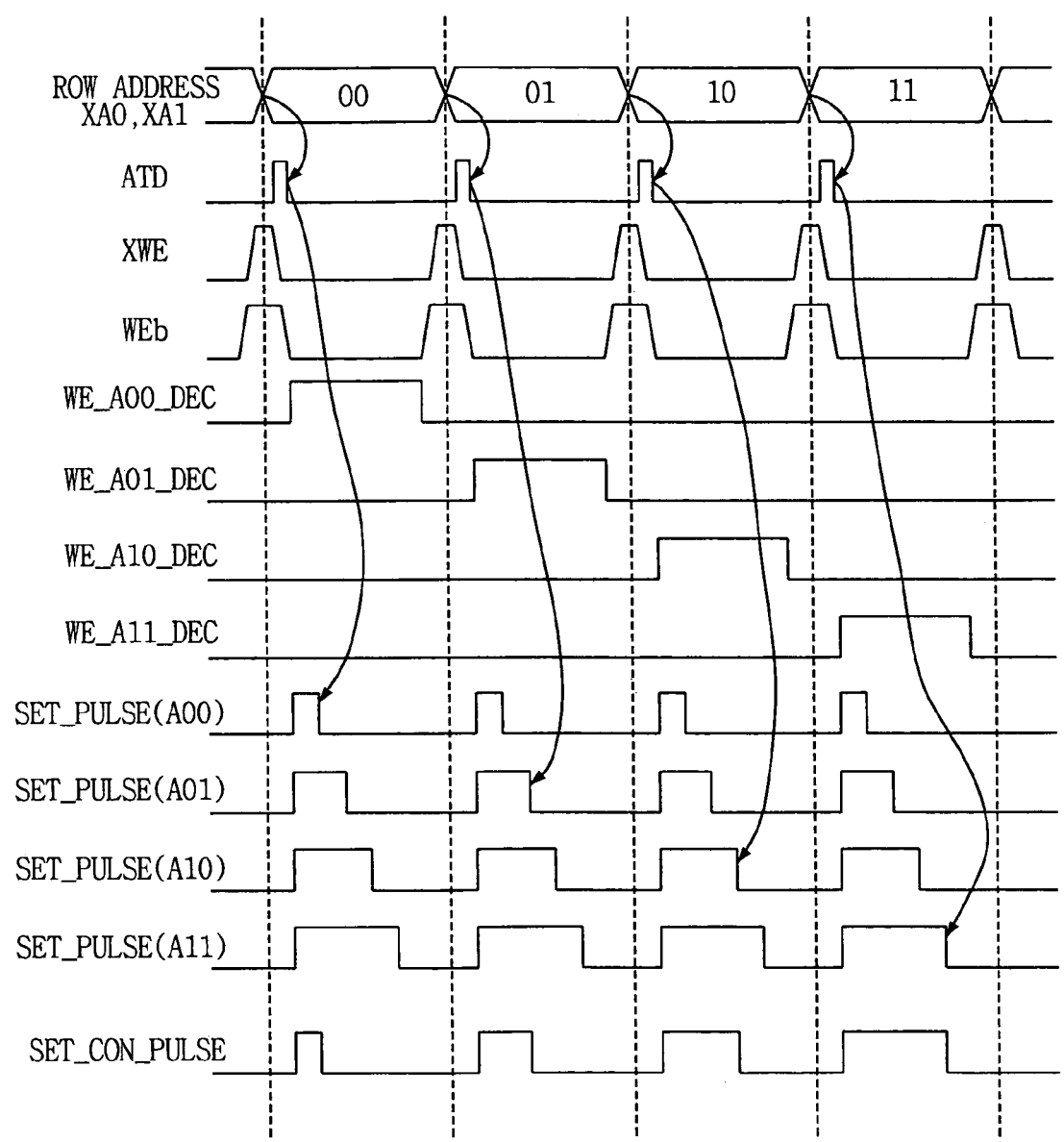
FIG. 17 is a timing diagram for describing the generation of set programming pulses according to an embodiment of the present invention.

FIG. 17 illustrates a timing diagram for explaining the generation of the SET programming pulse SET_CON_PULSE. As shown in this figure, the buffer write enable signal WEb is HIGH when the write enable signal XWE is HIGH. Further, responsive to the falling edge of the address transition detection (ATD) signal, the SET_CON_PULSE signal is generated. The SET_CON_PULSE signal corresponds to SET_PULSE (A00) when WEb is LOW and WE_A00_DEC is HIGH; the SET_CON_PULSE signal corresponds to SET_PULSE (A01) when WEb is LOW and WE_A01_DEC is HIGH; the SET_CON_PULSE signal corresponds to SET_PULSE (A10) when WEb is LOW and WE_A10_DEC is HIGH; and the SET_CON_PULSE signal corresponds to SET_PULSE (A11) when WEb is LOW and WE_A11_DEC is HIGH.

Figure 18:
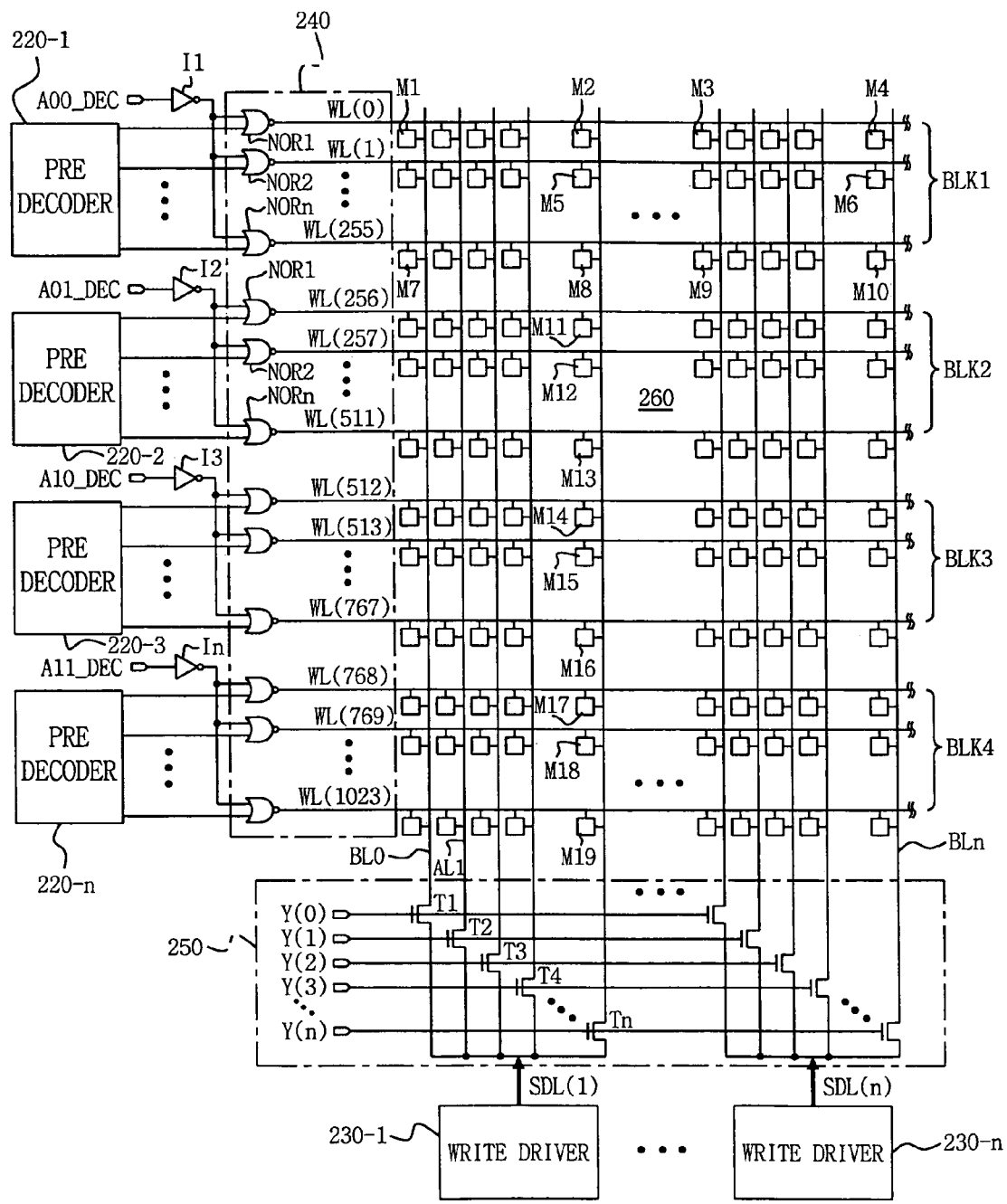
FIG. 18 is a circuit diagram of a main decoder, column decoder, and memory array according to an embodiment of the present invention.

For completeness of the explanation, FIG. 18 shows a detailed circuit diagram of phase-change random access memory (PRAM), including pre-decoders 220-1, 220-2, 220-3 and 220-4, a main decoder 240, column decoder 250, and a memory array according to an embodiment of the present invention. In this example, each block (BLK) of the memory array is comprised of 256 word lines (WL), with each word line WL coupled to a plurality of phase-change memory cells.

Outputs from the pre-decoders 220-1, 220-2, 220-3 through 220-n are applied to NOR elements of the main decoder 240, together with inverted decoded address signals from inverters I1 . . . In. The outputs of the NOR elements drive respective word lines WL. The column decoder 250 includes a plurality of select transistors T1 through Tn coupled between a corresponding write driver 230-1 . . . 230-n and bit lines BL0 . . . BLn.

The above-described first embodiment is generally characterized by controlling a write driver of a phase-change memory device such that the pulse width the SET pulse currents is varied according to a load between the write driver and an addressed memory cell. In this manner, over-programming of memory cells can be avoided, thus reducing the power consumption needed to reliably write the cells into the SET and RESET states.

Figure 19:
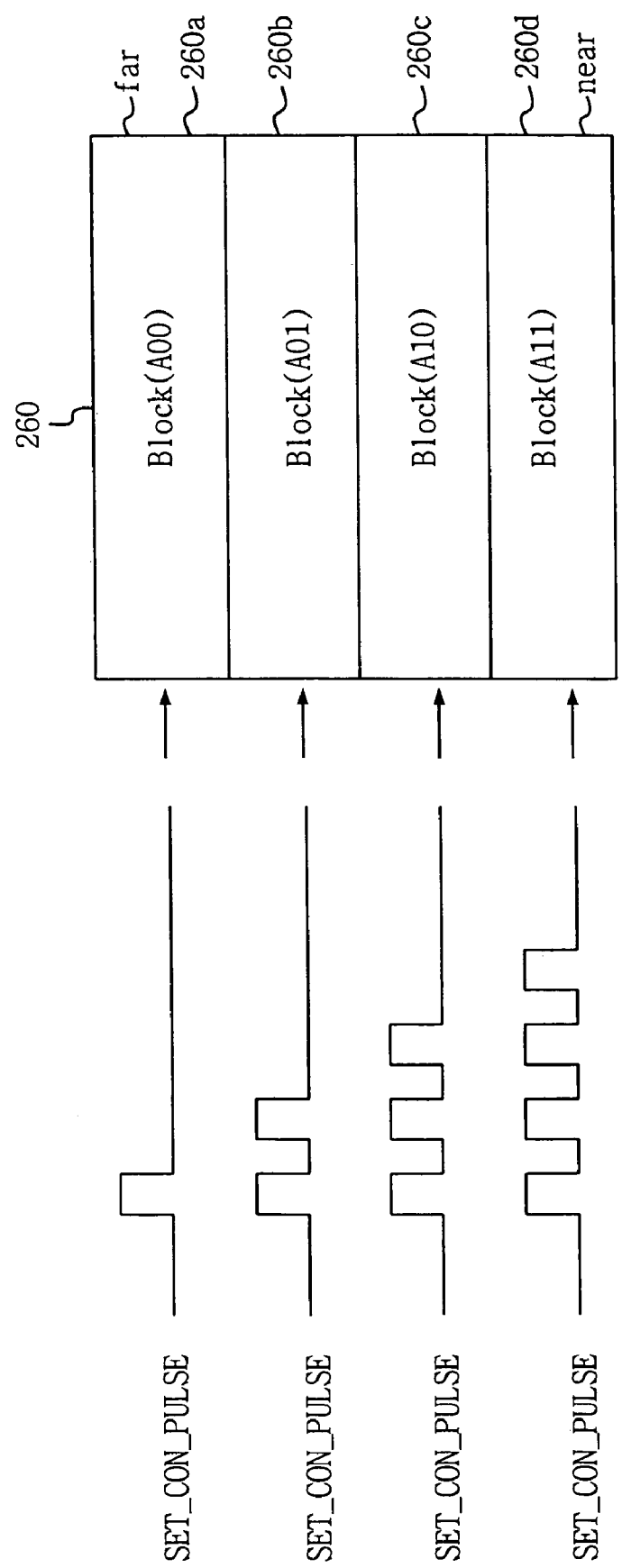
FIG. 19 illustrates set programming pulses applied to the phase-change memory cell blocks according to another embodiment of the present invention.

FIG. 19 illustrates an alternative to the first embodiment. That is, according to the second embodiment of FIG. 19, the write driver of the phase-change memory device is controlled such that the pulse count of the SET pulse currents is varied according to the load between the write driver and an addressed memory cell. As shown, different pulse counts of SET current control signals (SET_CON_PULSE) define pulse counts of the SET write current pulses applied to respective blocks 260a, 260b, 260c, and 260d, of the phase-change memory cell array 260. As illustrated in FIG. 19, the pulse count of a SET current signal input into a far block (260a) is less than the pulse count of a SET current signal input into a near block (260d).

Figure 20:
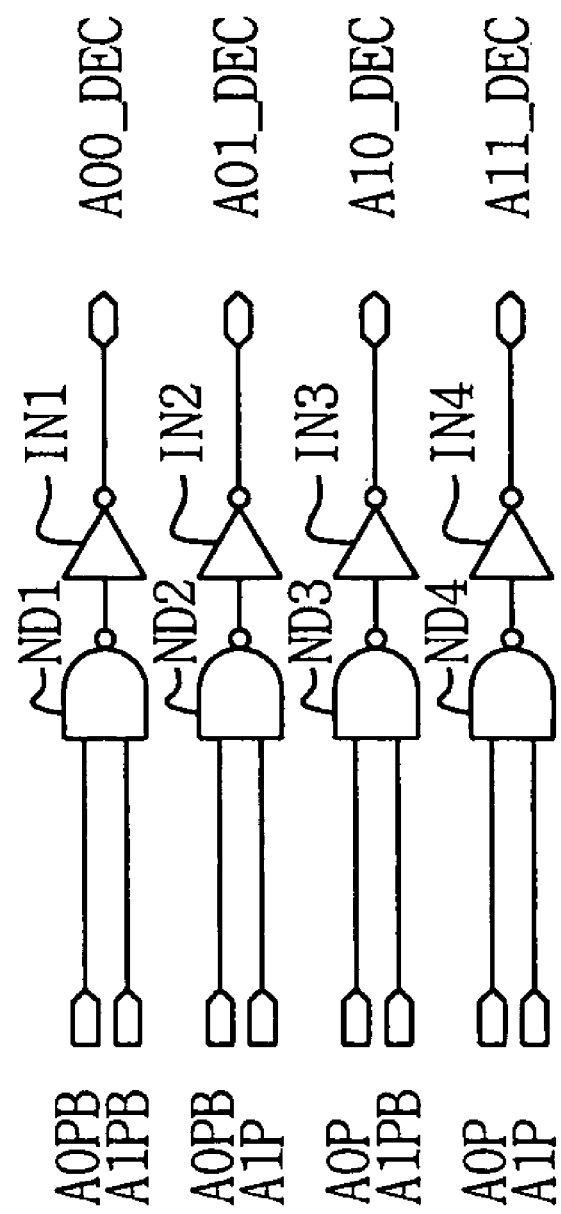
FIGS. 20 and 21 are circuit diagrams of a pre-decoder according to another embodiment of the present invention.
Figure 21:
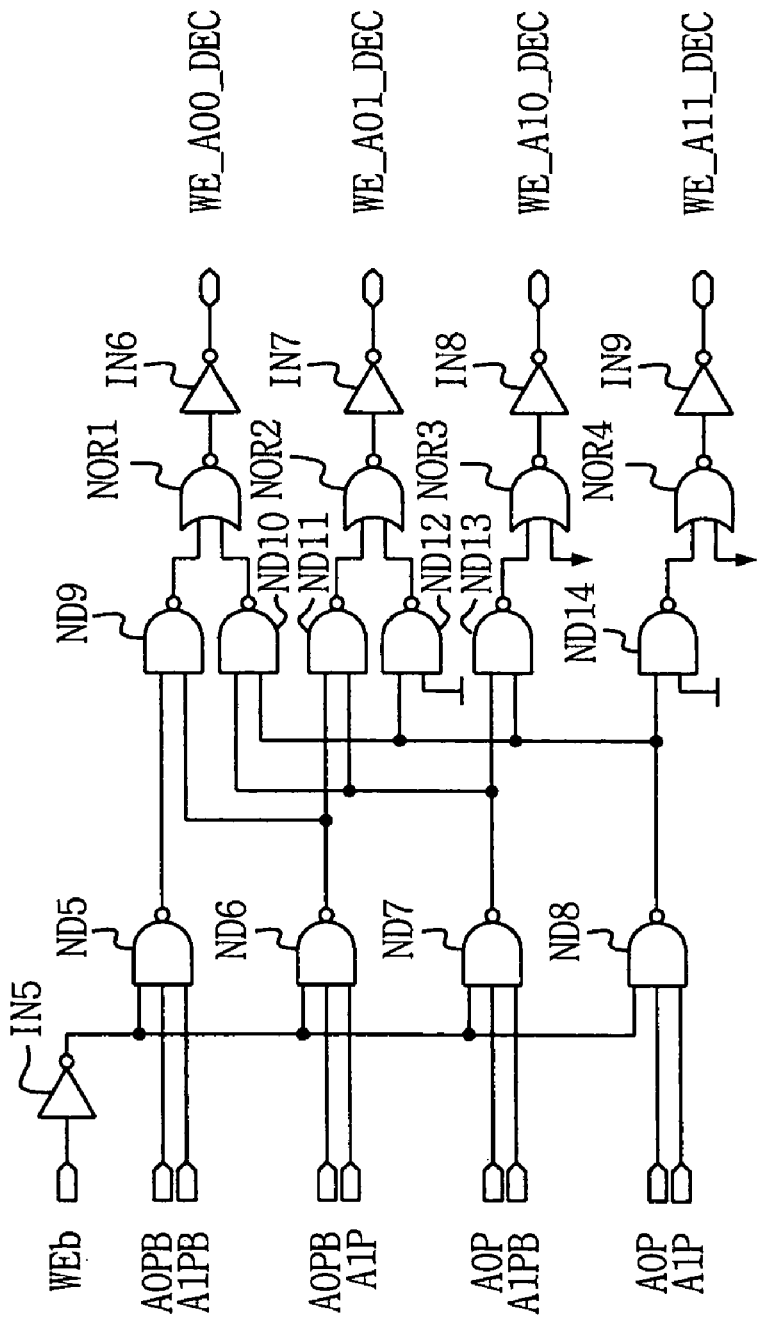

FIG. 20 and 21 illustrate the pre-decoder 220 of FIG. 8 in the case of the second embodiment of the present invention. In this specific example, the pre-decoder 220 includes NAND gates ND1 . . . ND14; NOR gates NOR1 . . . ND4; and inverters IN1 . . . IN9. As shown, the pre-decoder 220 receives the buffered address signals A0P, A0PB, A1P and A1PB, and the buffered write enable signal WEb, and outputs decoded address signals A00_DEC, A01_DEC, A10_DEC, and A11_DEC, and decoded write control signals WE_A00_DEC, WE_A01_DEC, WE_A10_DEC, and WE_A11_DEC. In this example, one or more of the decoded write control signals WE_A00_DEC, WE_A01_DEC, WE_A10_DEC, and WE_A11_DEC is HIGH when the buffered write enable signal WEb is LOW.

Figure 22:
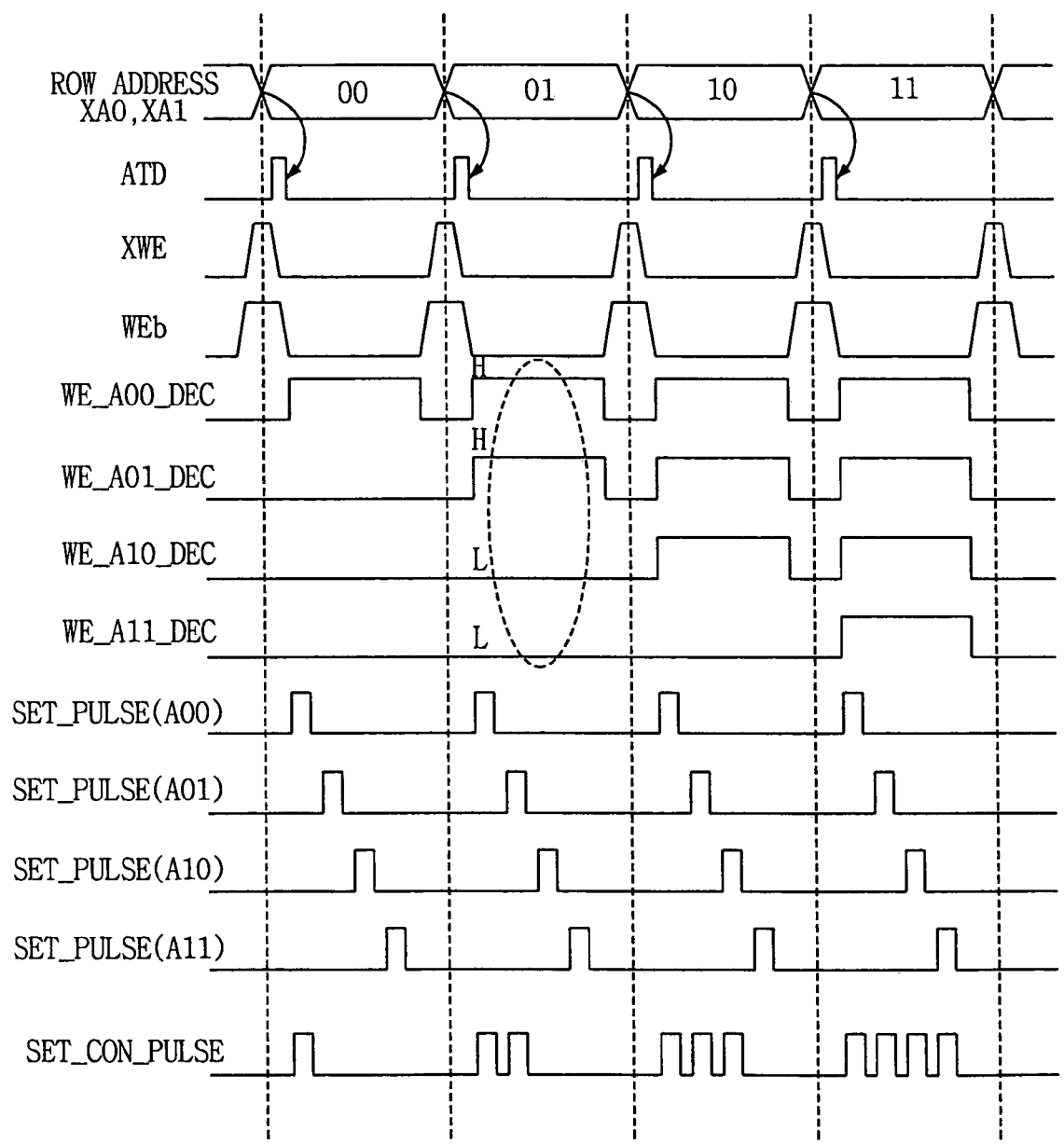
FIG. 22 is a timing diagram for describing the generation of set programming pulses according to another embodiment of the present invention.

FIG. 22 illustrates a timing diagram for explaining the generation of the SET programming pulse SET_CON_PULSE according to the second embodiment of the present invention. As shown in this figure, the buffer write enable signal WEb is HIGH when the write enable signal XWE is HIGH. Further, responsive to the falling edge of the address transition detection (ATD) signal, the SET_CON_PULSE signal is generated.

As shown in FIG. 22, the SET_CON_PULSE signal corresponds to SET_PULSE (A00) when WEb is LOW and only WE_A00_DEC is HIGH; the SET_CON_PULSE signal corresponds to the combination of SET_PULSE (A00) and SET_PULSE (A01) when WEb is LOW and only WE_A00_DEC and WE_A01_DEC are HIGH; the SET_CON_PULSE signal corresponds to the combination of SET_PULSE (A00), SET_PULSE (A01) and SET_PULSE (A10) when WEb is LOW and only WE_A00_DEC, WE_A01_DEC and WE A10_DEC are HIGH; the SET_CON_PULSE signal corresponds to combination of SET_PULSE (A00), SET_PULSE (A01), SET_PULSE (A0) and SET_PULSE (A11) when WEb is LOW and WE_A00_DEC, WE_A01_DEC, WE A10_DEC and WE_A11_DEC are all HIGH.

Figure 23:
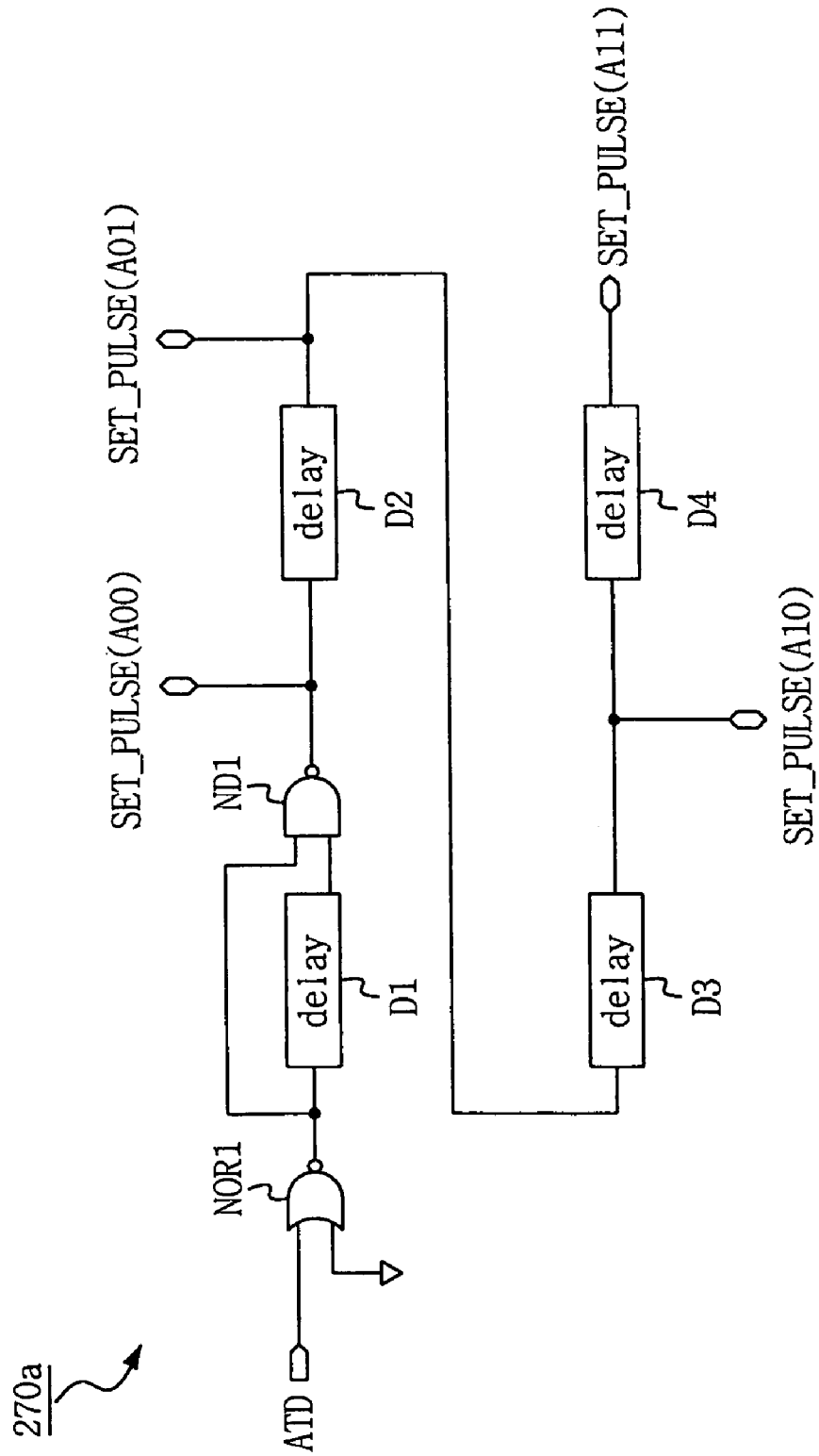
FIG. 23 is a circuit diagram of a set control pulse generator according to another embodiment of the present invention.

FIG. 23 is a circuit diagram of the SET control pulse generator 270 of FIG. 8 according to the second embodiment of the present invention. In this specific example, SET control pulse generator includes NOR gate NOR1; NAND gate ND1; and delay circuits D1, D2, D3, and D4. As should be apparent, the circuit of FIG. 23 is configured to output SET_PULSE signals (A01), (A01), (A10) and (A11) as illustrated in FIG. 22.

The above-described second embodiment is generally characterized by controlling a write driver of a phase-change memory device such that the pulse count of the SET pulse current is varied according to a load between the write driver and an addressed memory cell. In this manner, over-programming of memory cells can be avoided, thus reducing the power consumption needed to reliably write the cells into the SET and RESET states.

Figure 24:
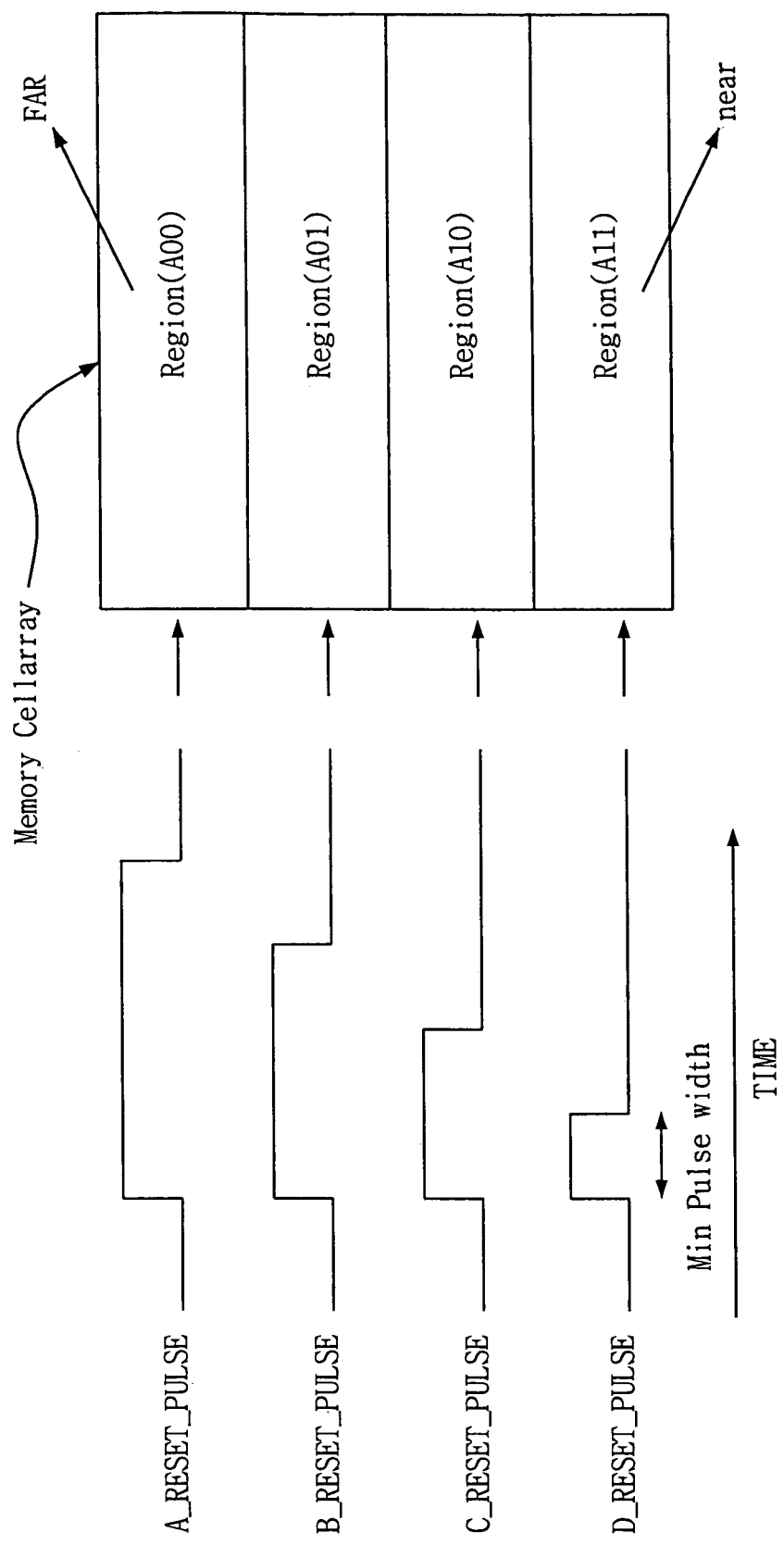
FIG. 24 illustrates reset programming pulses applied to the phase-change memory cell blocks according to yet another embodiment of the present invention.

FIG. 24 illustrates an alternative to the first and second embodiments. That is, according to the third embodiment of FIG. 24, the write driver of the phase-change memory device is controlled such that the pulse width of the RESET pulse currents is varied according to the load between the write driver and an addressed memory cell. As shown, different pulse widths of the RESET current control signals applied to respective blocks 260a, 260b, 260c, and 260d are defined by pulse widths of the RESET pulses A_RESET_PULSE, B_RESET_PULSE, C_RESET_PULSE, and D_RESET_PULSE. As illustrated in FIG. 24, the pulse width of a RESET current signal input into a far block Region (A00) is greater than the pulse width of a RESET current signal input into a near block Region (A11).

Figure 25:
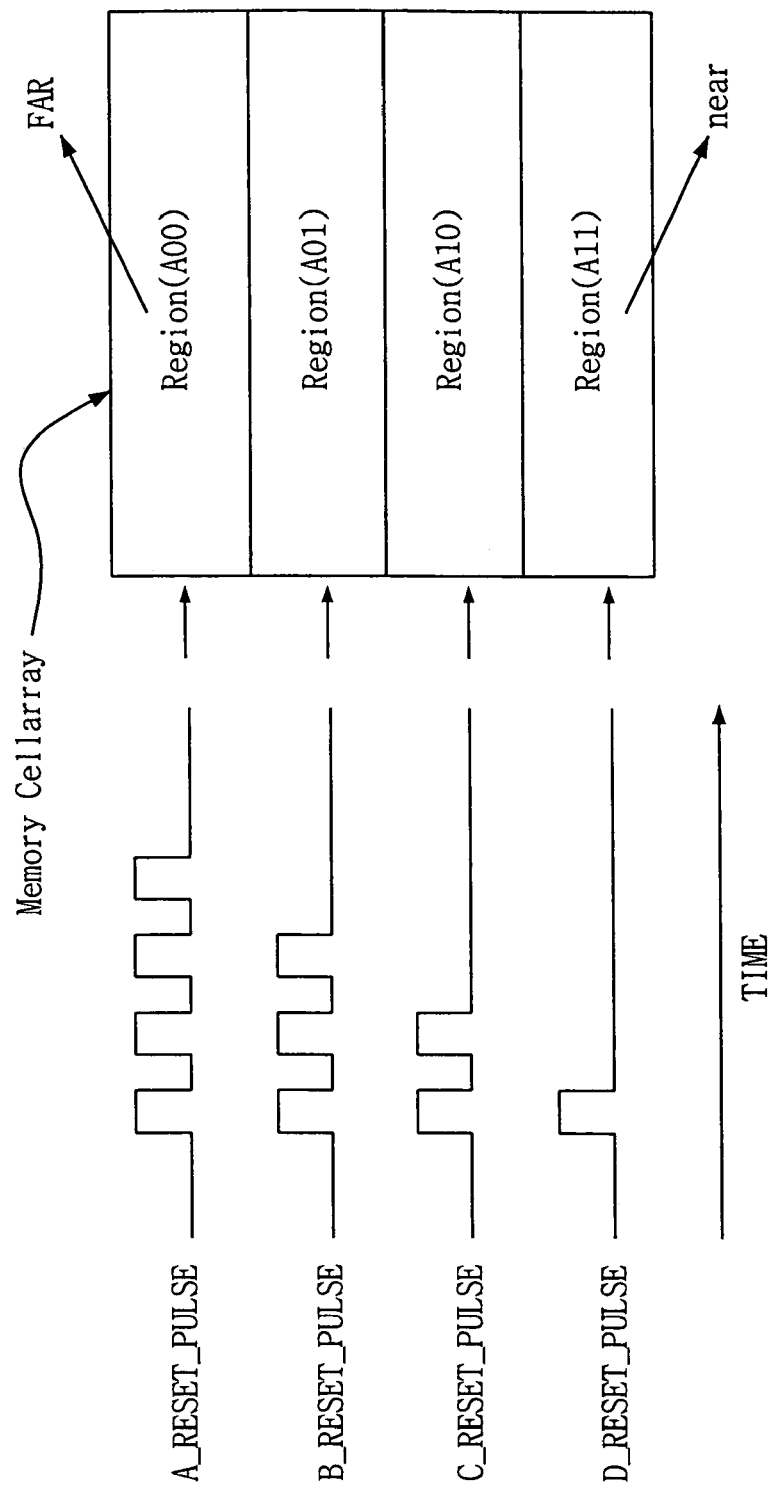
FIG. 25 illustrates reset programming pulses applied to the phase-change memory cell blocks according to yet another embodiment of the present invention.

FIG. 25 illustrates yet another alternative to the first through third embodiments. That is, according to the fourth embodiment of FIG. 25, the write driver of the phase-change memory device is controlled such that the pulse count of the RESET pulse currents is varied according to the load between the write driver and an addressed memory cell. As shown, different pulse counts of the RESET current control signals applied to respective blocks 260a, 260b, 260c, and 260d are defined by pulse counts of the RESET pulses A_RESET_PULSE, B_RESET_PULSE, C_RESET_PULSE, and D_RESET_PULSE. As illustrated in FIG. 25, the pulse count of a RESET current signal input into a far block Region (A00) is greater than the pulse count of a RESET current signal input into a near block Region (A11).

Figure 26:
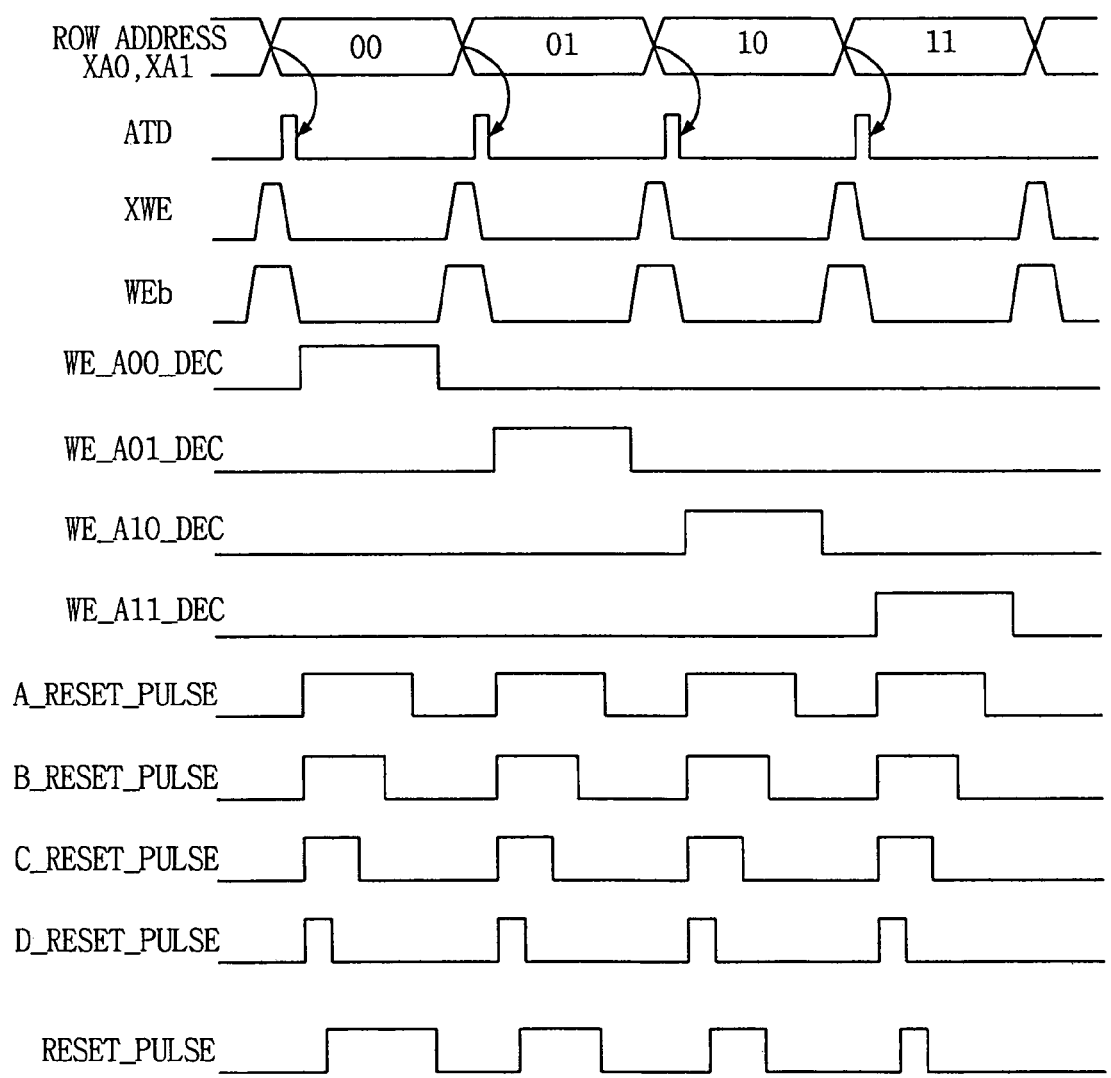
FIGS. 26 and 27 are timing diagrams for describing the generation of reset programming pulses according to other embodiments of the present invention.

FIG. 26 illustrates a timing diagram for explaining the generation of the RESET programming pulse RESET_CON_PULSE according to the third embodiment of the present invention. As shown in this figure, the buffer write enable signal WEb is HIGH when the write enable signal XWE is HIGH. Further, responsive to the falling edge of the address transition detection (ATD) signal, the RESET_CON_PULSE signal is generated.

As shown in FIG. 26, the RESET_CON_PULSE signal corresponds to A_RESET_PULSE when WEb is LOW and WE_A00_DEC is HIGH; the RESET_CON_PULSE signal corresponds to B_RESET_PULSE when WEb is LOW and WE_A01_DEC is HIGH; the RESET_CON_PULSE signal corresponds to C_RESET_PULSE when WEb is LOW and WE_A10_DEC is HIGH; and the RESET_CON_PULSE signal corresponds to D_SET_PULSE when WEb is LOW and WE_A11_DEC is all HIGH. In this case, A_RESET_PULSE, B_RESET_PULSE, C_RESET_PULSE, and D_SET_PULSE are as shown in FIG. 24.

Figure 27:
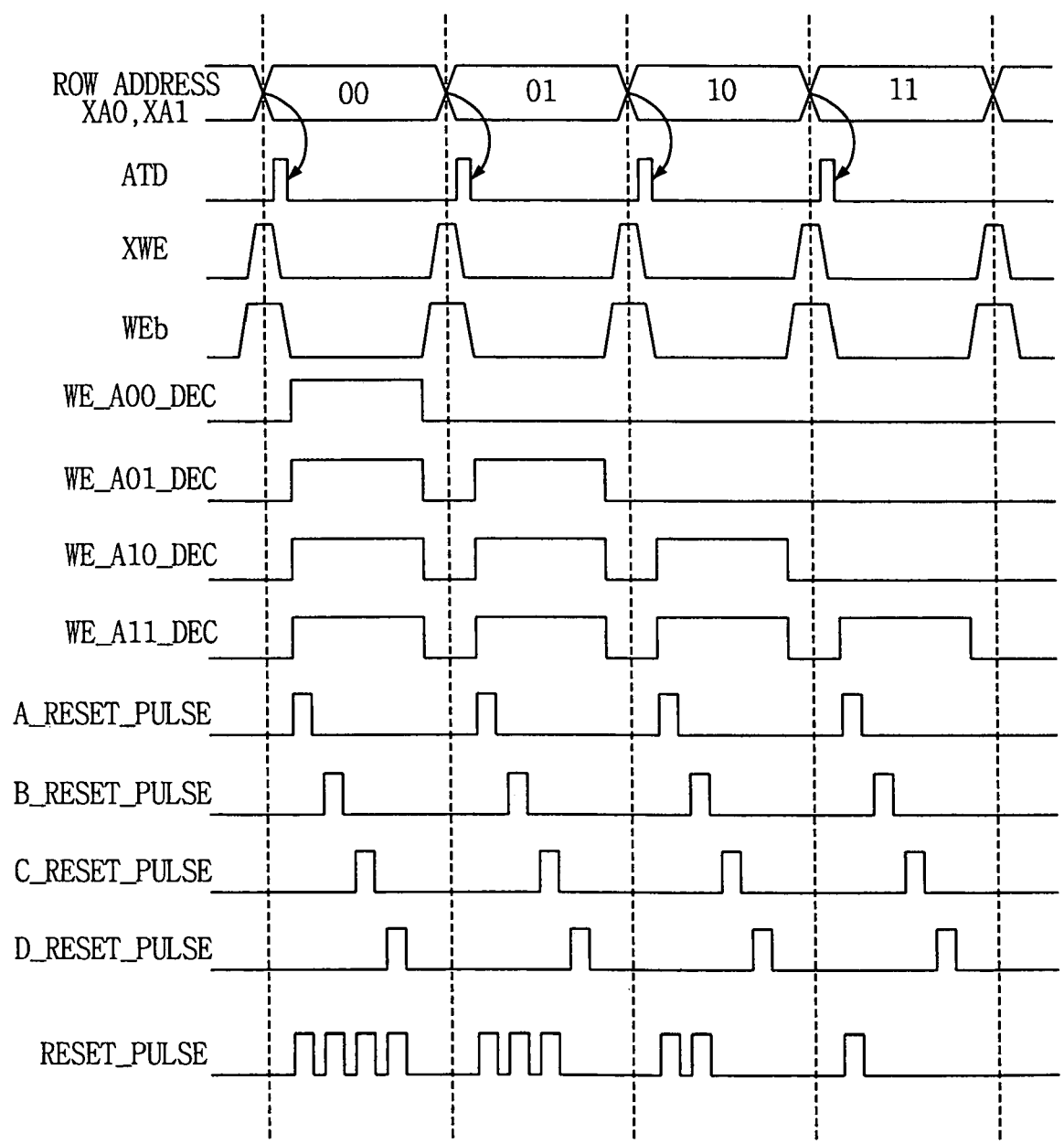

FIG. 27 illustrates a timing diagram for explaining the generation of the RESET programming pulse RESET_CON_PULSE according to the fourth embodiment of the present invention. As shown in this figure, the buffer write enable signal WEb is HIGH when the write enable signal XWE is HIGH. Further, responsive to the falling edge of the address transition detection (ATD) signal, the RESET_CON_PULSE signal is generated.

As shown in FIG. 27, the RESET_CON_PULSE signal corresponds to the combination of A_RESET_PULSE, B_RESET_PULSE, C_RESET_PULSE, and D_RESET_PULSE when WEb is LOW and WE_A00_DEC, WE_A01_DEC, WE_A10_DEC and WE_A11_DEC are all HIGH; the RESET_CON_PULSE signal corresponds to the combination of A_RESET_PULSE, B_RESET_PULSE, and C_RESET_PULSE when WEb is LOW and only WE_A01_DEC, WE_A10_DEC, and WE_A11_DEC are HIGH; the RESET_CON_PULSE signal corresponds to the combination of A_RESET_PULSE and B_RESET_PULSE when WEb is LOW and only WE_A10_DEC and WE_A11_DEC are HIGH; and the RESET_CON_PULSE signal corresponds to A_RESET_PULSE when WEb is LOW and only WE_A11_DEC is HIGH.

The above-described third and fourth embodiments are generally characterized by controlling a write driver of a phase-change memory device such that the pulse width or pulse count of the RESET pulse current is varied according to a load between the write driver and an addressed memory cell. In this manner, over-programming of memory cells can be avoided, thus reducing the power consumption needed to reliably write the cells into the RESET state.

It is noted that combinations of the above-described embodiments may also be implemented. For example, the pulse width and/or pulse count of both the RESET and SET write current pulses may be varied according to the load of the phase-change memory cell being written.

In the drawings and specification there have been disclosed embodiments of the present invention, including specific examples. This discussion is used in a generic and descriptive sense only and not purpose of limitation. It should be therefore understood that this invention is to be construed by the appended claims and not by the exemplary embodiments. Further, one of ordinary skill in the art would deviate from this disclosure without departing from the spirit and scope of the embodiments of the present invention.

The invention claimed is:

1. A phase-change cell memory device, comprising:
   a plurality of phase-change memory cells each including a volume of material that is programmable between amorphous and crystalline states;
   an address circuit which selects at least one of the memory cells;
   a write driver which generates a reset pulse current to program a memory cell selected by the address circuit into the amorphous state, and a set pulse current to program the memory cell selected by the address circuit into the crystalline state; and
   a write driver control circuit, coupled to the address circuit, which varies at least one of a pulse width and a pulse count of at least one of the reset and set pulse currents according to a load between the write driver and the memory cell selected by the address circuit.

2. The memory device of claim 1, wherein the write driver control circuit varies a pulse width of at least one of the reset and set pulse currents according to a load between the write driver and the memory cell selected by the address circuit.

3. The memory device of claim 2, wherein the pulse width of the reset pulse current is constant, and wherein the write driver control circuit decreases a pulse width of the set pulse current with an increase in load between the write driver and the memory cells selected by the address circuit.

4. The memory device of claim 2, wherein the pulse width of the set pulse current is constant, and wherein the write driver control circuit decreases a pulse width of the reset pulse current with an increase in load between the write driver and the memory cells selected by the address circuit.

5. The memory device of claim 2, wherein the pulse width of the reset pulse current is constant, and wherein the write driver control circuit increases a pulse width of the set pulse current with an increase in load between the write driver and the memory cells selected by the address circuit.

6. The memory device of claim 2, wherein the pulse width of the set pulse current is constant, and wherein the write driver control circuit increases a pulse width of the set pulse current with an increase in load between the write driver and the memory cells selected by the address circuit.

7. The memory device of claim 2, wherein the write driver control circuit increases a pulse width of the set and reset pulse currents with an increase in load between the write driver and the memory cells selected by the address circuit.

8. The memory device of claim 1, wherein the write driver control circuit varies a pulse count of at least one of the reset and set pulse currents according to a load between the write driver and the memory cell selected by the address circuit.

9. The memory device of claim 8, wherein the pulse count of the reset pulse current is constant, and wherein the write driver control circuit decreases a pulse count of the set pulse current with an increase in load between the write driver and the memory cells selected by the address circuit.

10. The memory device of claim 8, wherein the pulse count of the set pulse current is constant, and wherein the write driver control circuit decreases a pulse count of the reset pulse current with an increase in load between the write driver and the memory cells selected by the address circuit.

11. The memory device of claim 8, wherein the pulse count of the reset pulse current is constant, and wherein the write driver control circuit increases a pulse count of the set pulse current with an increase in load between the write driver and the memory cells selected by the address circuit.

12. The memory device of claim 8, wherein the pulse count of the set pulse current is constant, and wherein the write driver control circuit increases a pulse count of the set pulse current with an increase in load between the write driver and the memory cells selected by the address circuit.

13. The memory device of claim 8, wherein the write driver control circuit increases a pulse count of the set and reset pulse currents with an increase in load between the write driver and the memory cells selected by the address circuit.

14. The memory device of claim 1, wherein the memory device is a phase-change random access memory (PRAM).

15. A phase-change cell memory device, comprising:
   a plurality of memory cell blocks each including a plurality of phase-change memory cells, wherein each of the phase-change memory cells includes a volume of material that is programmable between amorphous and crystalline states;

an address circuit which selects each of the memory cell blocks;

a write driver which selectively generates a reset pulse current to program memory cells of a memory cell block selected by the address circuit into the amorphous set state, and a set pulse current to program memory cells of the memory cell block selected by the address circuit into the crystalline state; and a write driver control circuit which varies at least one of a pulse width and a pulse count of at least of the set and reset pulse currents according to the memory cell block selected by the address circuit.

16. The memory device of claim 15, wherein the write driver control circuit varies a pulse width of at least one of the reset and set pulse currents according to a load between the write driver and the memory cell block selected by the address circuit.

17. The memory device of claim 16, wherein the write driver control circuit comprises a control pulse generator which generates a plurality of control pulse signals having respectively different pulse widths, and a multiplexer which selectively applies one of the control pulse signals to the write driver according the memory cell block selected by the address circuit.

18. The memory device of claim 17, wherein the control pulse generator is enabled by an ATD (Address Transition Detection) signal.

19. The memory device of claim 15, wherein the write driver control circuit varies a pulse count of at least one of the reset and set pulse currents according to a load between the write driver and the memory cell block selected by the address circuit.

20. The memory device of claim 19, wherein the write driver control circuit comprises a control pulse generator which generates a plurality of control pulse signals having respectively different timings, and a multiplexer which selectively applies one or more of the control pulse signals to the write driver according the memory cell block selected by the address circuit.

21. The memory device of claim 20, wherein the control pulse generator is enabled by an ATD (Address Transition Detection) signal.

22. The memory device of claim 15, wherein the memory device is a phase-change random access memory (PRAM).

23. A phase-change cell memory device, comprising:

a phase-change memory cell array which includes a plurality of word lines, a plurality of bit lines, and a plurality of phase-change cells at respective intersection regions of the word lines and bit lines, wherein the memory cell array is defined by a plurality of memory blocks each including at least one word line, and wherein each of the phase-change memory cells includes a volume of material that is programmable between amorphous and crystalline states;

an address decoder which decodes an input row address to select a word line of each memory block, and to select one of the memory blocks;

a bit line selection circuit which selects at least one bit line according to an input column address;

a write driver, coupled to the bit line selection circuit, which selectively generates a reset pulse current to program a memory cell at the intersection of the selected bit line and the selected word line within the selected memory block into the amorphous set state, and a set pulse current to program a memory cell at the intersection of the selected bit line and the selected word line within the selected memory block into the crystalline state; and a write driver control circuit which varies at least one a pulse width and a pulse count of at least one of the set and reset pulse currents according to the memory cell block selected by the address decoder.

24. The memory device of claim 23, wherein the write driver control circuit varies a pulse width of at least one of the reset and set pulse currents according to a load between the write driver and the memory cell block selected by the address circuit.

25. The memory device of claim 24, wherein the write driver control circuit comprises a control pulse generator which generates a plurality of control pulse signals having respectively different pulse widths, and a multiplexer which selectively applies one of the control pulse signals to the write driver according the memory cell block selected by the address circuit.

26. The memory device of claim 25, wherein the address decoder generates a plurality of memory block write enable signals, and wherein the multiplexer is responsive to the memory block write enable signals to selectively apply one of the control pulse signals to the write driver.

27. The memory device of claim 25, wherein the control pulse generator is enabled by an ATD (Address Transition Detection) signal.

28. The memory device of claim 26, wherein the control pulse generator is enabled by an ATD (Address Transition Detection) signal.

29. The memory device of claim 23, wherein the write driver control circuit varies a pulse count of at least one of the reset and set pulse currents according to a load between the write driver and the memory cell block selected by the address circuit.

30. The memory device of claim 29, wherein the write driver control circuit comprises a control pulse generator which generates a plurality of control pulse signals having respectively different timings, and a multiplexer which selectively applies one or more of the control pulse signals to the write driver according the memory cell block selected by the address circuit.

31. The memory device of claim 30, wherein the address decoder generates a plurality of memory block write enable signals, and wherein the multiplexer is responsive to the memory block write enable signals to selectively apply one or more of the control pulse signals to the write driver.

32. The memory device of claim 30, wherein the control pulse generator is enabled by an ATD (Address Transition Detection) signal.

33. The memory device of claim 31, wherein the control pulse generator is enabled by an ATD (Address Transition Detection) signal.

34. The memory device of claim 23, wherein the memory device is a phase-change random access memory (PRAM).

35. A method of programming a phase-change memory device having a plurality of phase-change memory cells each including a volume of material that is programmable between amorphous and crystalline states, said method comprising:

using a write driver to selectively generate a reset pulse current to program the memory cells selected by an address circuit into the amorphous state, and a set pulse current to program the memory cells selected by the address circuit into the crystalline state; and varying at least one of a pulse width and a pulse count of the reset and set pulse currents according to a load between the write driver and the memory cells being programmed.

36. The method of claim 35, wherein a pulse width of at least one of the reset and set pulse currents is varied according to a load between the write driver and the memory cell selected by the address circuit.

37. The method of claim 36, wherein the pulse width of the reset pulse current is constant, and wherein a pulse width of the set pulse current is decreased with an increase in load between the write driver and the memory cells selected by the address circuit.

38. The method of claim 36, wherein the pulse width of the set pulse current is constant, and wherein a pulse width of the reset pulse current is decreased with an increase in load between the write driver and the memory cells selected by the address circuit.

39. The method of claim 36, wherein the pulse width of the reset pulse current is constant, and wherein a pulse width of the set pulse current is increased with an increase in load between the write driver and the memory cells selected by the address circuit.

40. The method of claim 36, wherein the pulse width of the set pulse current is constant, and wherein a pulse width of the set pulse current is increased with an increase in load between the write driver and the memory cells selected by the address circuit.

41. The method of claim 36, wherein a pulse width of the set and reset pulse currents is increased with an increase in load between the write driver and the memory cells selected by the address circuit.

42. The method of claim 35, wherein a pulse count of at least one of the reset and set pulse currents is varied according to a load between the write driver and the memory cell selected by the address circuit.

43. The method of claim 42, wherein the pulse count of the reset pulse current is constant, and wherein a pulse count of the set pulse current is decreased with an increase in load between the write driver and the memory cells selected by the address circuit.

44. The method of claim 42, wherein the pulse count of the set pulse current is constant, and wherein a pulse count of the reset pulse current is decreased with an increase in load between the write driver and the memory cells selected by the address circuit.

45. The method of claim 42, wherein the pulse count of the reset pulse current is constant, and wherein a pulse count of the set pulse current is increased with an increase in load between the write driver and the memory cells selected by the address circuit.

46. The method of claim 42, wherein the pulse count of the set pulse current is constant, and wherein a pulse count of the set pulse current is increased with an increase in load between the write driver and the memory cells selected by the address circuit.

47. The method of claim 42, wherein a pulse count of the set and reset pulse currents is increased with an increase in load between the write driver and the memory cells selected by the address circuit.

48. The memory device of claim 35, wherein the memory device is a phase-change random access memory (PRAM).

* * * * *